(12) United States Patent
Ogawa

(10) Patent No.: US 6,940,084 B2
(45) Date of Patent: Sep. 6, 2005

(54) SOLID STATE RADIATION DETECTOR

(75) Inventor: Masaharu Ogawa, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 6 days.

(21) Appl. No.: 10/188,046

(22) Filed: Jul. 3, 2002

(65) Prior Publication Data
US 2003/0006388 A1 Jan. 9, 2003

(30) Foreign Application Priority Data

| Jul. 4, 2001 | (JP) | 2001-203050 |
| Jul. 4, 2001 | (JP) | 2001-203051 |
| Apr. 24, 2002 | (JP) | 2002-121623 |
| Apr. 24, 2002 | (JP) | 2002-121624 |

(51) Int. Cl.[7] .................................................. G01J 5/00
(52) U.S. Cl. ........................................ 250/591; 250/580
(58) Field of Search .................................. 250/591, 580

(56) References Cited

U.S. PATENT DOCUMENTS

| 4,535,468 A | 8/1985 | Kempter |
| 6,268,614 B1 | 7/2001 | Imai |
| 6,455,867 B2 * | 9/2002 | Ogawa ........................ 250/580 |
| 6,566,676 B1 * | 5/2003 | Kuwabara ................. 250/591 |
| 2001/0025935 A1 * | 10/2001 | Ogawa ........................ 250/580 |

FOREIGN PATENT DOCUMENTS

| EP | 1 041 400 A2 | 10/2000 |
| EP | 1 041 401 A2 | 10/2000 |
| JP | 2000-105297 A | 4/2000 |
| JP | 2000-284056 A | 10/2000 |
| JP | 2000-284057 A | 10/2000 |

* cited by examiner

Primary Examiner—Constantine Hannaher
(74) Attorney, Agent, or Firm—Sughrue Mion, PLLC

(57) ABSTRACT

A solid state radiation detector provided with sub-stripe electrodes, which is capable of reading out stored charges efficiently. A first conductive layer, a recording photoconductive layer, a charge transport layer, a reading photoconductive layer, a second conductive layer provided with stripe electrodes composed of a large number of linear elements and sub-stripe electrodes composed of a large number of linear elements, an insulating layer, and a support body are arranged in accordance with the order listed above, light-shielding films are provided on portions on the support body, which correspond to the sub-stripe electrodes and the spaces between the stripe electrodes and the sub-stripe electrodes, and thus a solid state radiation detector is constituted. In this case, when a pair of the stripe electrode and the sub-strip electrode is defined as one cycle, the cycle is set to range from 10 μm through 150 μm.

6 Claims, 15 Drawing Sheets

X-Y CROSS SECTION

X-Z CROSS SECTION

SOLID STATE RADIATION DETECTOR

BACKGROUND OF THE INVENTION

1. Field of the Invention

The present invention relates to a solid state radiation detector having a capacitor unit for storing, as latent image charges, charges of an amount in response to a dosage of radiation irradiated thereto or an amount of light generated by excitation by the radiation.

2. Description of the Related Art

Presently, in radiation imaging for the purpose of medical diagnosis and the like, there are proposed various types of radiation image information recording/reading apparatuses using a solid state radiation detector (hereinafter, simply referred to as a detector in some cases). In the solid state radiation detector, charges obtained by detecting radiation are stored as latent image charges in a capacitor unit, the stored latent image charges are converted into electric signals representing radiation image information, and the electric signals are outputted. Various types of the solid state radiation detectors for use in these apparatuses are proposed. Among them, there is one of an optical reading system, in which reading light (reading electromagnetic wave) is irradiated onto a surface of the detector, from which the stored charges are read out to the outside in a charge reading-out process, and the charges are read out.

In Japanese Unexamined Patent Publication Nos. 2000-105297, 2000-284056 and 2000-284057, there are proposed a detector as will be described below as a solid state radiation detector of the optical reading system, which is capable of combining high-speed responsiveness of the reading out with high efficiency in extracting signal charges. Specifically, there is proposed a detector including: a first conductive layer having a transmissivity to light generated by recording radiation or excitation by the radiation (hereinafter, referred to as recording light); a recording photoconductive layer exhibiting a conductivity by receiving the recording light; a charge transport layer operating approximately as an insulator for charges of the same polarity as that of charges charged in the first conductive layer and operating approximately as a conductor for charges of a polarity reverse to that of the charges of the same polarity; a reading photoconductive layer exhibiting a conductivity by receiving irradiation of the reading light; and a second conductive layer having a transmissivity to the reading light, the detector being composed by stacking the above-described constituents in accordance with the order listed above, wherein signal charges (latent image charges) bearing image information are stored in a capacitor unit formed on an interface between the recording photoconductive layer and the charge transport layer.

Moreover, in the above-described Japanese Unexamined Patent Publication Nos. 2000-284056 and 2000-284057, particularly, there is proposed a detector as will be described below. In the detector, stripe electrodes are used for electrodes of the second conductive layer having a transmissivity to the reading light, the stripe electrodes being composed of optical charge pair generating linear electrodes having a transmissivity to a large number of reading light. Moreover, sub-stripe electrodes are provided in the second conductive layer so as to be alternate with the optical charge pair generating linear electrodes (stripe electrodes) and to be parallel thereto. The sub-stripe electrodes are composed of a large number of optical charge pair non-generating linear electrodes for outputting electric signals on a level in response to an amount of the latent image charges stored in the capacitor unit.

As described above, the sub-stripe electrodes composed of the large number of optical charge pair non-generating linear electrodes are provided in the second conductive layer. Thus, a new capacitor is formed between the capacitor unit and the sub-stripe electrodes, and thus charge rearrangement during the reading can charge the sub-stripe electrodes with transported charges of the polarity reverse to that of the latent image charges stored in the capacitor unit by the recording light. Thus, an amount of the transported charges distributed through the reading photoconductive layer to the capacitor formed between the stripe electrodes and the capacitor unit can be reduced to be relatively smaller than the case without providing these sub-stripe electrodes. Consequently, the amount of signal charges extractable from the detector to the outside can be increased to improve the reading efficiency, and the high-speed responsiveness of the reading out and the high efficiency in extracting the signal charges can be combined with each other.

Incidentally, in the detector provided with the sub-stripe electrodes as described above, a width of each optical charge pair generating linear electrode, a width of each optical charge non-generating linear electrode, and a width between the linear electrodes greatly influence the reading efficiency of the stored charges.

For example, in the case where the width of the optical charge pair generating linear electrode and the width of the optical charge non-generating linear electrode are narrowed, there is a fear that the reading signals are delayed since electric resistances of these linear electrodes are increased and that the electrodes are disconnected due to an etching defect and the like during manufacturing thereof.

Moreover, in the case where the width between the linear electrodes is narrowed, there is a fear that an electric discharge occurs to short-circuit the respective linear electrodes when a high voltage is applied thereto and that the linear electrodes are short-circuited due to interfusion of dust and the like during manufacturing of the electrodes.

Furthermore, in the case where the width of the optical charge pair generating linear electrode, the width of the optical charge non-generating linear electrode and the width between the linear electrodes are widened, an optical path is elongated, in which optically generated charges erase the latent image charges stored in the capacitor unit. Therefore, the reading efficiency of the detector is reduced.

Meanwhile, a ratio of the width of the optical charge pair generating linear electrode and the width of the optical charge pair non-generating linear electrode also influences the reading efficiency of the stored charges greatly.

For example, suppose the case where the width of the optical charge pair non-generating linear electrode is widened more than the width of the optical charge pair generating linear electrode. Then, when the first conductive layer and the second conductive layer are short-circuited after irradiating the recording radiation thereto, the amount of charges induced to the optical charge pair non-generating linear electrode is increased. Therefore, signal detection efficiency is improved. On the other hand, since the width of the optical charge pair generating linear electrode is narrow, an amount of effective light during the optical reading is reduced, and a line resistance of the optical charge pair generating linear electrode is increased, and thus it becomes difficult to detect the signals.

Moreover, in the case where the width of the optical charge pair non-generating linear electrode is narrowed more than the width of the optical charge pair generating linear electrode, the width of the optical charge pair generating linear electrode is wide. Therefore, the amount of effective light during the optical reading is high, and the line resistance of the optical charge pair generating linear electrode is reduced, and thus it becomes easy to detect the signals. On the other hand, when the first conductive layer and the second conductive layer are short-circuited after irradiating the recording radiation thereto, the amount of charges induced to the optical charge pair non-generating linear electrode is reduced. Therefore, the signal detection efficiency is lowered.

As described above, unless the width of each linear electrode, the width between the linear electrodes and the ratio of the widths of the both linear electrodes are optimized, then various problems occur.

SUMMARY OF THE INVENTION

The present invention was made in consideration of the above-described circumstances. An object of the present invention is to provide a solid state radiation detector provided with sub-stripe electrodes, which is capable of reading out stored charges efficiently.

A first solid state radiation detector according to the present invention is a solid state radiation detector including: a first conducting layer having a transmissivity to recording light; a recording photoconductive layer exhibiting a photoconductivity by receiving irradiation of the recording light; a capacitor unit for storing, as latent image charges, charges of an amount in response to an amount of the recording light; a reading photoconductive layer exhibiting a photoconductivity by receiving irradiation of reading light; and a second conductive layer having a large number of optical charge pair generating linear electrodes having a transmissivity to the reading light and a large number of optical charge pair non-generating linear electrodes arranged alternately with the optical charge pair generating linear electrodes, the solid state radiation detector being composed by stacking the above-described constituents in accordance with the order listed above, wherein, when a pair of the optical charge pair generating linear electrode and the optical charge pair non-generating linear electrode is set as one cycle, the cycle ranges from 10 μm through 150 μm.

Here, "a pair of the optical charge pair generating linear electrode and the optical charge pair non-generating linear electrode is set as one cycle" implies the following. Specifically, as shown in FIG. 2, one cycle is set from a middle between an optical charge pair generating linear electrode of a pair A and an optical charge pair non-generating linear electrode of a pair B adjacent to the pair A to a middle between an optical charge pair non-generating linear electrode of the pair A and an optical charge pair generating linear electrode of a pair C adjacent to the pair A. Therefore, a width of the "cycle" corresponds to a length from the middle between the optical charge pair generating linear electrode of the pair A and the optical charge pair non-generating linear electrode of the pair B adjacent to the pair A to the middle between the optical charge pair non-generating linear electrode of the pair A and the optical charge pair generating linear electrode of the pair C adjacent to the pair A. Moreover, a pixel pitch may not be equal to the above-described cycle. For example, one pixel may be constituted of linear electrodes for four cycles. Furthermore, the above-described pairs may not be arranged continuously. For example, as shown in FIG. 6, a mode can also be adopted, in which an interval for one pair is spaced for every three pairs (one pair is thinned out).

Moreover, in the detector provided with the sub-stripe electrodes described in the above-described gazette of Japanese Unexamined Patent Publication No. 2000-284056, the inventor of the present invention investigated a relationship between the reading efficiency and the ratio of the width of the optical charge pair non-generating linear electrode to the width of the optical charge pair generating linear electrode. As a result of this investigation, the inventor found out that a relationship as shown in FIG. 15 was present therebetween. FIG. 15 is a graph showing the relationship between the reading efficiency represented on the vertical axis and the ratio of the width of the optical charge pair non-generating linear electrode to the width of the optical charge pair generating linear electrode, which is represented on the horizontal axis.

Heretofore, it had been thought that the reading efficiency is rather improved when the width of the optical charge pair non-generating linear electrode is widened to some extent more than the width of the optical charge generating linear electrode. However, according to this investigation, as shown in FIG. 15, it was found that the reading efficiency is elevated to be highest when the ratio is 1, that is, when the width of the optical charge pair generating linear electrode and the width of the optical charge pair non-generating linear electrode are equal to each other.

A second solid state radiation detector according to the present invention was made based on the above-described novel knowledge. Namely, the second solid state radiation detector according to the present invention is a solid state radiation detector including: a first conducting layer having a transmissivity to recording light; a recording photoconductive layer exhibiting a photoconductivity by receiving irradiation of the recording light; a capacitor unit for storing, as latent image charges, charges of an amount in response to an amount of the recording light; a reading photoconductive layer exhibiting a photoconductivity by receiving irradiation of reading light; and a second conductive layer having a large number of optical charge pair generating linear electrodes having a transmissivity to the reading light and a large number of optical charge pair non-generating linear electrodes arranged alternately with the optical charge pair generating linear electrodes, the solid state radiation detector being composed by stacking the above-described constituents in accordance with the order listed above, wherein a ratio of the width of the optical charge pair non-generating linear electrode to the width of the optical charge pair generating linear electrode ranges from 0.5 through 10.

In the above-described second solid state radiation detector, it is more preferable that the ratio of the width of the optical charge pair non-generating linear electrode to the width of the optical charge pair generating linear electrode ranges from 0.8 through 1.5.

In the present invention, the "solid state radiation detector" includes the first conductive layer, the recording photoconductive layer, the reading photoconductive layer and the second conductive layer in accordance with the order listed above, in which the capacitor unit is formed between the recording photoconductive layer and the reading photoconductive layer. The solid state radiation detector may include other layers, micro conductive members (microplates) and the like in a stacking manner. Moreover, for this solid state radiation detector, anything may be used as long as it can allow the recording apparatus to record image information therein as an electrostatic latent image by irradiating light (radiation or light generated by excitation by the radiation) thereto, which bears radiation image information.

Note that, as methods for forming the capacitor unit, methods to be described below are recommended for use: a method for forming a capacitor unit, in which a charge transport layer is provided, and on an interface between the charge transport layer and the recording photoconductive layer, the capacitor unit is formed (refer to the gazettes of Japanese Unexamined Patent Publication Nos. 2000-105297 and 2000-284056); a method for forming a capacitor unit, in which a trap layer is provided, and in this trap layer or on an interface between the trap layer and the recording photoconductive layer, the capacitor unit is formed (for example, refer to U.S. Pat. No. 4,535,468); a method for forming a capacitor unit, in which a micro conductive member for concentrating and storing latent image charges or the like is provided (refer to the gazette of Japanese Unexamined Patent Publication No. 2000-284057); and the like.

Moreover, the "optical charge pair generating linear electrode having a transmissivity to the reading light" is an electrode for transmitting the reading light therethrough and for generating charge pairs in the reading photo conductive layer. Moreover, the "optical charge pair non-generating linear electrode" is an electrode for outputting electric signals on a level in response to the amount of the latent image charges stored in the capacitor unit. It is desirable that the optical charge pair non-generating linear electrode have a light shielding effect on the reading light. However, in the case where a light-shielding film having a light shielding effect is provided between the optical charge pair non-generating linear electrodes and means for irradiating reading light, the optical charge pair non-generating linear electrode does not always have to have the light shielding effect. Here, the "light shielding effect" is not limited to that wherein the reading light is completely shielded to not generate the charge pairs at all, but may include that wherein even if some degree of transmissivity to the reading light is present, charge pairs generated thereby are not substantially a problem. Hence, the charge pairs generated in the reading photoconductive layer are generated not only by the reading light transmitting through the optical charge pair generating linear electrode but also by the reading light slightly transmitting through the optical charge non-generating linear electrode.

Furthermore, the "reading light" may be anything as long as it can move electric charges in an electrostatic recording medium and read an electrostatic latent image electrically. Specifically, the reading light is light, radiation or the like.

Note that, when an radiation image is recorded and read by use of the detector according to the present invention, a recording method, a reading method and an apparatus thereof, which use a conventional detector to which the present invention is not applied, can be used as they are without being modified. Such a conventional detector is, for example, as described in the gazette of Japanese Unexamined Patent Publication No. 2000-284056.

In accordance with the first solid state radiation detector according to the present invention, when the pair of the optical charge pair generating linear electrode and the optical charge pair non-generating liner electrode is defined as one cycle, this cycle is optimized in the range from 10 $\mu$m through 150 $\mu$m. Therefore, the amount of extractable stored charges can be increased, and thus the reading efficiency and S/N ratio of the image can be improved.

Namely, in the case where the cycle is narrowed more than 10 $\mu$m, there is a fear that the reading signals are delayed since electric resistances of the linear electrodes are increased and that the electrodes are disconnected due to an etching defect and the like during manufacturing thereof. Moreover, since the width between the linear electrodes is narrowed, there is a fear that an electric discharge occurs to short-circuit the respective linear electrodes when a high voltage is applied thereto and that the linear electrodes are short-circuited due to interfusion of dust and the like during manufacturing of the electrodes.

Moreover, in the case where the cycle is widened more than 150 $\mu$m, a distance from the center of the optical charge pair generating linear electrode to the center of the optical charge pair non-generating linear electrode adjacent thereto is elongated. Therefore, an optical path is elongated, in which optically generated charges erase the latent image charges stored in the capacitor unit. Therefore, the reading efficiency of the detector is lowered.

In this connection, these problems can be avoided by setting the above-described cycle in the range from 10 $\mu$m through 150 $\mu$m, and thus it is made possible to provide a highly reliable solid state radiation detector.

Moreover, in accordance with the second solid state radiation detector according to the present invention, the ratio of the optical charge pair non-generating linear electrode to the width of the optical charge generating linear electrode is optimized in the range from 0.5 through 10. Therefore, the amount of extractable stored charges can be increased, and thus the reading efficiency and the S/N ratio of the image can be improved.

Namely, as shown in the above-described FIG. 15, the ratio of the optical charge pair non-generating linear electrode to the width of the optical charge generating linear electrode is set in the range from 0.5 through 10. Thus, the reading efficiency close to the highest reading efficiency can be realized, and the S/N ratio of the image can be improved. Moreover, if this ratio is set in the range from 0.8 through 1.5, more excellent reading efficiency can be realized.

DESCRIPTION OF THE PREFERRED EMBODIMENTS

Figure 1A:
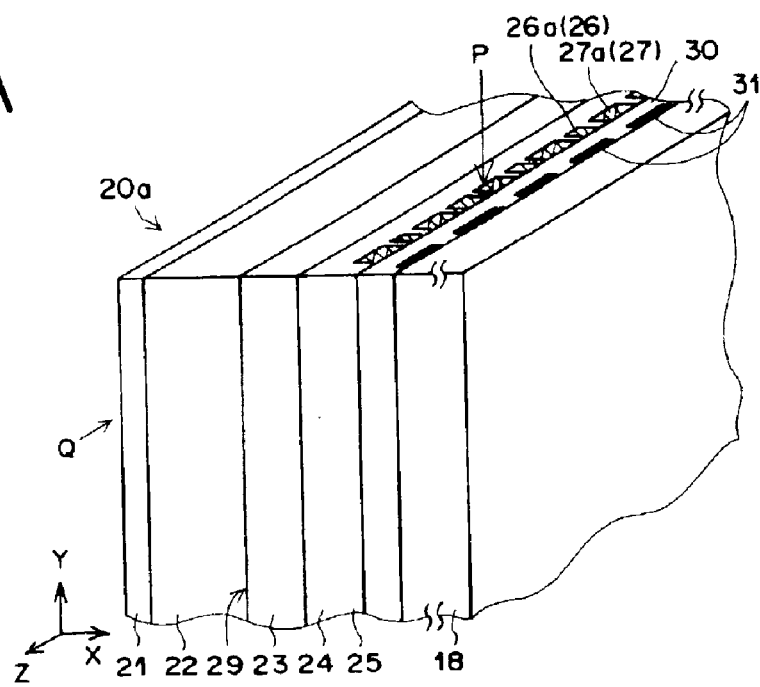
FIG. 1A is an exploded view of a solid state radiation detector according to a first embodiment of the present invention.
Figure 1B:
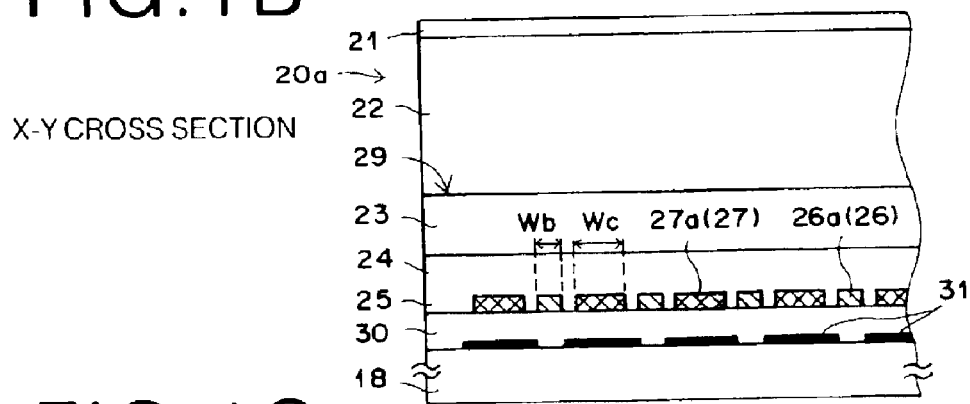
FIG. 1B is an X-Z cross-sectional view of a portion indicated by an arrow Q of FIG. 1A.
Figure 1C:
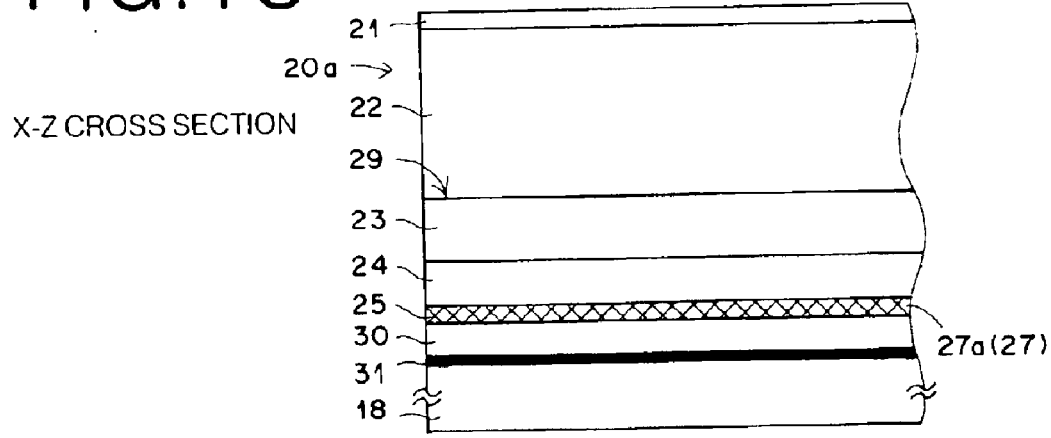
FIG. 1C is an X-Y cross-sectional view of a portion indicated by an arrow P of FIG. 1A.
Figure 2:
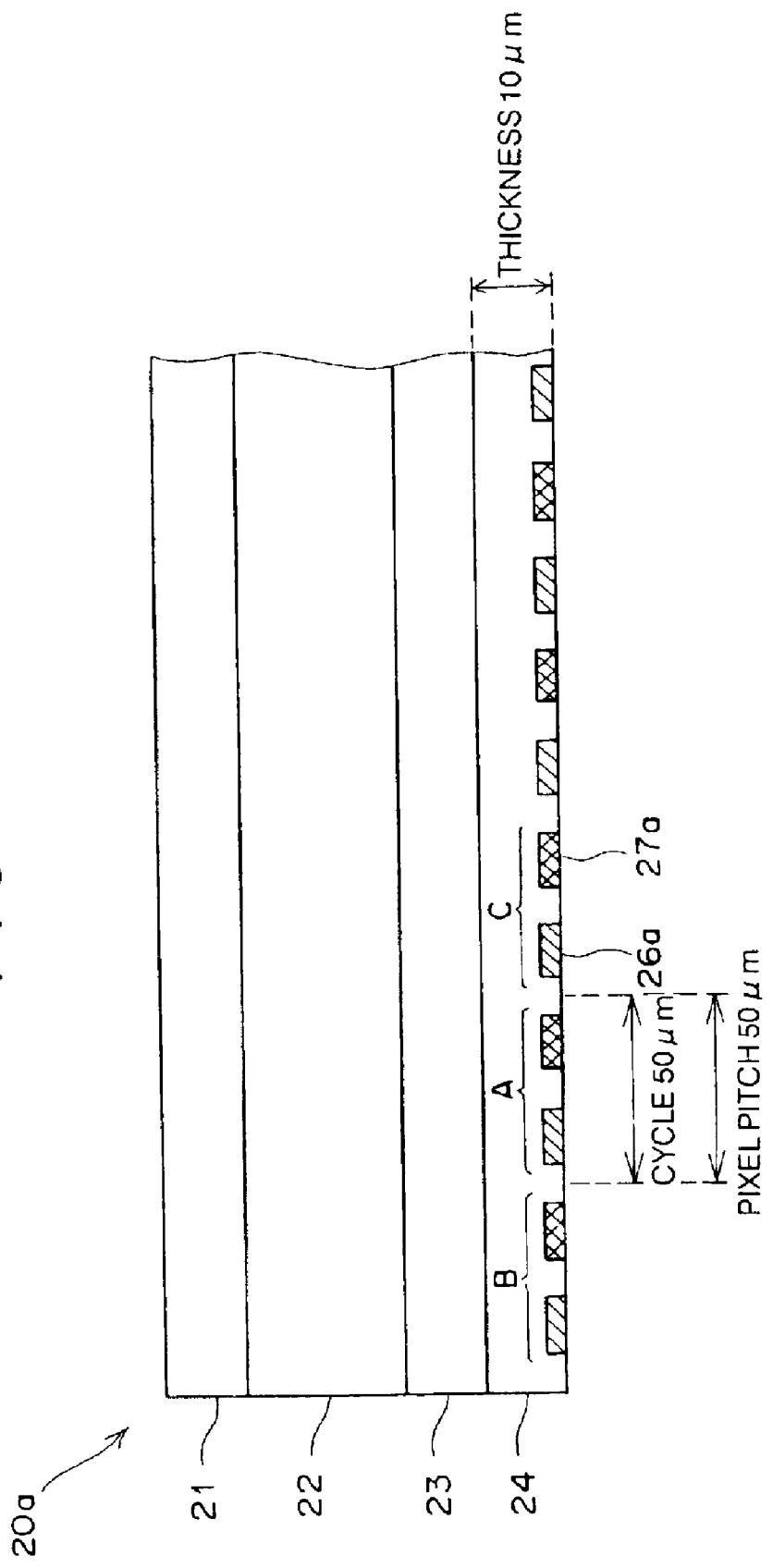
FIG. 2 is a cross-sectional view of the solid state radiation detector according to the first embodiment of the present invention.

Hereinafter, description will be made for embodiments of the present invention with reference to the drawings. FIGS. 1A, 1B and 1C are views schematically showing a first embodiment of a solid state radiation detector of the present invention. FIG. 1A is an exploded view of a solid state radiation detector 20$a$, FIG. 1B is an X-Z cross-sectional view of a portion of the solid state radiation detector 20$a$, which is indicated by an arrow Q of FIG. 1A, and FIG. 1C is an X-Y cross-sectional view of a portion of the solid state radiation detector 20$a$, which is indicated by an arrow P of FIG. 1A. In addition, FIG. 2 is a cross-sectional view similar to FIG. 1B, which is for explaining a cycle when a pair of a charge pair generating linear electrode and a charge pair non-generating linear electrode is defined as one cycle. Note that, in FIG. 2, illustration of a support body 18, an insulating layer 30 and light-shielding films 31 is omitted. Note that the solid state radiation detector of this embodiment corresponds to a first solid state radiation detector according to the present invention.

This solid state radiation detector 20$a$ includes: a first conductive layer 21 having a transmissivity to recording light (radiation or light generated by excitation by the radiation), which bears image information of radiation such as an X-ray transmitting through a subject; a recording photoconductive layer 22 generating charge pairs to exhibit a conductivity by receiving irradiation of the recording light transmitting through the first conductive layer 21; a charge transport layer 23 operating approximately as an insulator for charges of a latent image polarity (for example, negative) among the charge pairs and operating approximately as a conductor for charges of a transported polarity (positive in the above-described example), which is reverse to that of the charges of the latent image polarity; a reading photoconductive layer 24 generating charge pairs to exhibit a conductivity by receiving irradiation of reading light; a second conductive layer 25 having stripe electrodes 26 and sub-stripe electrodes 27; an insulating layer 30 having a transmissivity to the reading light; and a support body 18 having a transmissivity to the reading light, the solid state radiation detector being composed by arranging the above-described constituents in accordance with the order listed above. On an interface between the recording photoconductive layer 22 and the charge transport layer 23, a two-dimensionally distributed capacitor unit 29 for storing the charges of the latent image polarity is formed, the charges bearing image information generated in the recording photoconductive layer 22.

For the support body 18, a glass substrate transparent to the reading light or the like can be used. Moreover, it is more desirable to use a material having a thermal expansion coefficient relatively close to a thermal expansion coefficient of a material of the reading photoconductive layer 24 in addition to the transparency to the reading light. For example, suppose the case where amorphous selenium (a-Se) is used for the reading photoconductive layer 24. In this case, considering that the thermal expansion coefficient of Se is $3.68 \times 10^{-5}/K@40°$ C., a material is used, which has a thermal expansion coefficient ranging from $1.0 \times 10^{-5}/K@40°$ C. to $10.0 \times 10^{-5}/K@40°$ C., and preferably, from $4.0 \times 10^{-5}/K@40°$ C. to $8.0 \times 10^{-5}/K@40°$ C. As a material having the thermal expansion coefficient in this range, an organic polymer material such as polycarbonate and polymethylmethacrylate (PMMA) can be used. Thus, matching in thermal expansion between the support body 18 as a substrate and the reading photoconductive layer 24 (Se film) is achieved. Then, even if the solid state radiation detector is subjected to a large-amplitude temperature cycle while being transported by vessel and so on under a particular environment, for example, under a cold climate condition, problems of destruction caused by a difference in thermal expansion do not occur. The problems may include physical exfoliation of the support body 18 and the reading photoconductive layer 24, a break of the reading photoconductive layer 24, a crack of the support body 18 and the like, all of which may be caused by a heat stress occurring on the interface between the support body 18 and the reading photoconductive layer 24. Furthermore, the organic polymer material has a merit of being stronger against an impact than the glass substrate.

A material suitable for the recording photoconductive layer 22 is a photoconductive material containing, as a main component, at least one of amorphous selenium (a-Se), lead oxide (II) and lead iodide (II) such as PbO and PbI$_2$, Bi$_{12}$(Ge, Si)O$_{20}$, Bi$_2$I$_3$/organic polymer nanocomposite and the like.

In a material of the charge transport layer 23, for example, a mobility of positive charges should have a difference as large as possible from a mobility of negative charges charged in the first conductive layer 21, the positive charges being reverse to the negative charges. For example, the difference should be $10^2$ times or more, and desirably, $10^3$ times or more. The material suitable for the charge transport layer 23 includes an organic compound such as poly N-vinyl carbazole (PVK), N,N'-diphenyl-N,N'-bis(3-methylphenyl)-[1,1'-biphenyl]-4,4'-diamine (TPD) and a discotic liquid crystal, a TPD polymer (polycarbonate, polystyrene, PVK) dispersion, and a semiconductor material such as a-Se doped with 10 to 200 ppm of Cl. In particular, the organic compound (PVK, TPD, discotic liquid crystal and the like) is preferred because of possession of light insensitivity. In addition, since the organic compound generally possesses a small dielectric constant, it is possible to reduce capacities of the charge transport layer 23 and the reading photoconductive layer 24, thus enhancing the signal extraction efficiency during the reading. Note that the above-described "possession of light insensitivity" implies a phenomenon to exhibit very little conductivity upon receiving irradiation of the recording light or the reading light.

A material suitable for the reading photoconductive layer 24 is a photoconductive material containing, as a main component, at least one of a-Se, Se—Te, Se—As—Te, nonmetal phthalocyanine, metal phthalocyanine, magnesium phthalocyanine (MgPc), phase II of vanadyl phthalocyanine (VoPc) and copper phthalocyanine (CuPc).

A thickness of the recording photoconductive layer 22 is preferably set in a range from 50 μm through 1000 μm in order to absorb the recording light sufficiently.

Moreover, an aggregate thickness of the charge transport layer 23 and the reading photoconductive layer 24 is preferably set to ½ or less than the thickness of the recording photoconductive layer 22. Since the responsiveness during the reading is enhanced as the above-described aggregate thickness becomes thinner, the aggregate thickness is preferably set to ¹⁄₁₀ or less, and more preferably to ¹⁄₁₀₀ or less, and so on.

Note that the materials of the respective layers described above are examples suitable for the purposes to be described below. Namely, by use of such materials, the first conductive layer 21 should be charged with the negative charges, and the second conductive layer 25 should be charged with the positive charges, and thus the negative charges as the charges of the latent image polarity should be stored in the capacitor unit 29 formed on the interface between the recording photoconductive layer 22 and the charge transport layer 23. In addition, by use of such materials, the charge transport layer 23 should be allowed to function as a so-called hole transport layer, in which the mobility of the positive charges as charges of a transport polarity reverse to that of the negative charges is larger than the mobility of the negative charges as the charges of the latent image polarity. However, the above-described charges may be reverse in polarity, respectively. When the polarities are reversed as described above, some change is sufficient, in which the charge transport layer functioning as the hole transport layer is changed to the charge transport layer functioning as an electron transport layer, and so on.

For example, for the recording photoconductive layer 22, the above-described photoconductive materials including amorphous selenium a-Se, lead oxide (II), lead iodide (II) and the like can be used similarly. In addition, for the charge transport layer 23, a dielectric material of N-trinitrofluorenylidene aniline (TNFA), a disperse system of trinitrofluorenone (TNF)/polyester and a derivative of asymmetric diphenoquinone are suitable. Further, for the reading photoconductive layer 24, the above-described nonmetal phthalocyanine and metal phthalocyanine can be used similarly.

Moreover, in the detector 20a, the capacitor unit 29 is formed on the interface between the recording photoconductive layer 22 and the charge transport layer 23. However, not being limited to this, as described in U.S. Pat. No. 4,535,468 for example, the capacitor unit may be formed of a trap layer for storing the charges of the latent image polarity as traps.

It is sufficient if the first conductive layer 21 has a transmissivity to the recording light. For example, in the case where a transmissivity to visible light is imparted to the first conductive layer 21, metal oxide set to have a thickness approximately ranging from 50 through 200 nm, and preferably, of 100 nm or more can be used, the metal oxide including a NESA film ($SnO_2$) and indium tin oxide (ITO) which are well known as light-transmitting metal thin films, and Idemitsu Indium X-metal Oxide (IDIXO; Idemitsu Kosan Co., Ltd.) as amorphous light-transmitting metal oxide that is easily subjected to etching. Moreover, pure metal such as aluminum (Al), gold (Au), molybdenum (Mo) and chrome (Cr) is set to have a thickness, for example, of 20 nm (and preferably, approximate 10 nm), and thus making it possible to impart thereto the transmissivity to the visible light. Note that, in the case where an X-ray is used as the recording light, and the X-ray is irradiated from a side of the first conductive layer 21 to record the image, the transmissivity to the visible light is not required for the first conductive layer 21, and therefore, pure metal such as Al and Au having a thickness, for example, of 100 nm can be used for the first conductive layer 21.

The second conductive layer 25 includes the stripe electrodes 26 composed by arraying, in a stripe fashion, the large number of elements (optical charge pair generating linear electrodes) having a transmissivity to the reading light, and the sub-stripe electrodes 27 composed by arraying, in a stripe fashion, the large number of elements (optical charge non-generating linear electrodes) having a light-shielding effect on the reading light. Each of the elements 26a and each of the elements 27a is arrayed so as to be alternate with the other and to be parallel thereto. The reading photoconductive layer 24 is partially interposed between the both elements, and the stripe electrodes 26 and the sub-stripe electrodes 27 are electrically insulated from each other. The sub-stripe electrodes 27 are conductive members for outputting electric signals on the level in response to the amount of the latent image charges stored in the capacitor unit 29 formed on the approximate interface between the recording photoconductive layer 22 and the charge transport layer 23.

Here, as an electrode material for forming the elements 26a of the stripe electrodes 26, indium tin oxide (ITO), Idemitsu Indium X-metal Oxide (IDIXO; Idemitsu Kosan Co., Ltd.), aluminum, molybdenum or the like can be used. Moreover, as an electrode material for forming the elements 27a of the sub-stripe electrodes 27, aluminum, molybdenum, chrome or the like can be used.

Note that, in this embodiment, a thickness of the reading photoconductive layer 24 is set at 10 μm. In addition, each width of the element 26a and the element 27a is set at 15 μm, and the width of a space between the adjacent elements is set at 10 μm. Namely, one cycle is set at 50 μm. Furthermore, the pixel pitch is set at 50 μm, and the electrodes for one pixel are constituted of one pair of the elements.

Furthermore, on portions on the support body 18, which correspond to the elements 27a and the spaces between the elements 26a and the elements 27a, there are provided light-shielding films 31 composed of members inferior in light transmissivity so that an irradiation intensity of the reading light to the elements 27a can be lowered more than an irradiation intensity of the reading light to the elements 26a.

A member of the light-shielding films 31 does not always have to have an insulating property, and for the light-shielding films 31, a member having a specific resistance of $2 \times 10^{-6}$ or more (and more preferably, $1 \times 10^{15}$ Ω·cm or less) can be used. For example, in the case of a metal material, Al, Mo, Cr and the like can be used. In the case of an organic material, $MOS_2$, $WSi_2$, TiN and the like can be used. Note that it is more preferable to use the light-shielding films 31 having a specific resistance of 1 Ω·cm or more.

Moreover, at least when a conductive member such as a metal material is used as a member of the light-shielding films 31, in order to avoid direct contact of the light-shielding films 31 and the elements 27a, an insulator is disposed therebetween. In the detector 20a of this embodiment, as this insulator, the insulating layer 30 composed of $SiO_2$ or the like is provided between the second conductive layer 25 and the support body 18. A thickness of this insulator 30 should be set approximately in a range from 0.01 through 10 μm, more preferably, approximately in a range from 0.1 through 1 μm, and most preferably, approximately at 0.5 μm.

In the detector 20a, a capacitor C*a is formed between the first conductive layer 21 and the capacitor unit 29 while sandwiching the recording photoconductive layer 22. Moreover, a capacitor C*b is formed between the capacitor unit 29 and the stripe electrodes 26 (elements 26a) while sandwiching the charge transport layer 23 and the reading photoconductive layer 24. Furthermore, a capacitor C*c is formed between the capacitor unit 29 and the sub-stripe electrodes 27 (elements 27a) with the reading photoconductive layer 24 and the charge transport layer 23 interposed therebetween. When the charges are rearranged during the reading, with regard to amounts of positive charges Q+a, Q+b and Q+c distributed respectively to the capacitors C*a, C*b and C*c, the aggregate Q+ thereof is equal to the amount of the charges Q− of the latent image polarity, and each amount of the positive charges Q+a, Q+b and Q+c is proportional to each of capacitances Ca, Cb and Cc of the capacitors. The above-described relationships can be represented in the following formulae.

$$Q-=Q+=Q+a+Q+b+Q+c$$

$$Q+a=Q+\times Ca/(Ca+Cb+Cc)$$

$$Q+b=Q+\times Cb/(Ca+Cb+Cc)$$

$$Q+c=Q+\times Cc/(Ca+Cb+Cc)$$

Then, the amount of signal charges extractable from the detector 20a becomes equal to the aggregate (Q+a+Q+C) of the amounts of positive charges Q+a and Q+C distributed respectively to the capacitors C*a and C*c, and the positive charges distributed to the capacitor C*b cannot be extracted as signal charges. For details, refer to the gazette of Japanese Unexamined Patent Publication No. 2000-284056.

Here, consideration is made for the capacitances of the capacitors C*b and C*c formed by the stripe electrodes 26 and the sub-stripe electrodes 27. Then, a capacitance ratio thereof Cb: Cc becomes a width ratio Wb: Wc of the elements 26a and 27a. Meanwhile, the capacitance Ca of the capacitor C*a and the capacitance Cb of the capacitor C*b are not influenced to a large extent even if the sub-stripe electrodes 27 are provided.

Consequently, when the charges are rearranged during the reading, the amount of positive charges Q+b distributed to the capacitor C*b can be reduced to be relatively smaller than in the case without providing the sub-stripe electrodes. For this amount, the amount of signal charges extractable from the detector 20a through the sub-stripe electrodes 27 can be increased to be relatively larger than in the case without providing the sub-stripe electrodes 27.

In the solid state radiation detector according to this embodiment, when the pair of the element 26a and the element 27a is defined as one cycle, this cycle is set at 50 μm, which is within the preferable range from 10 μm through 150 μm. Therefore, the amount of extractable stored charges can be increased, and the reading efficiency and the S/N ratio of the image can be improved.

Figure 3:
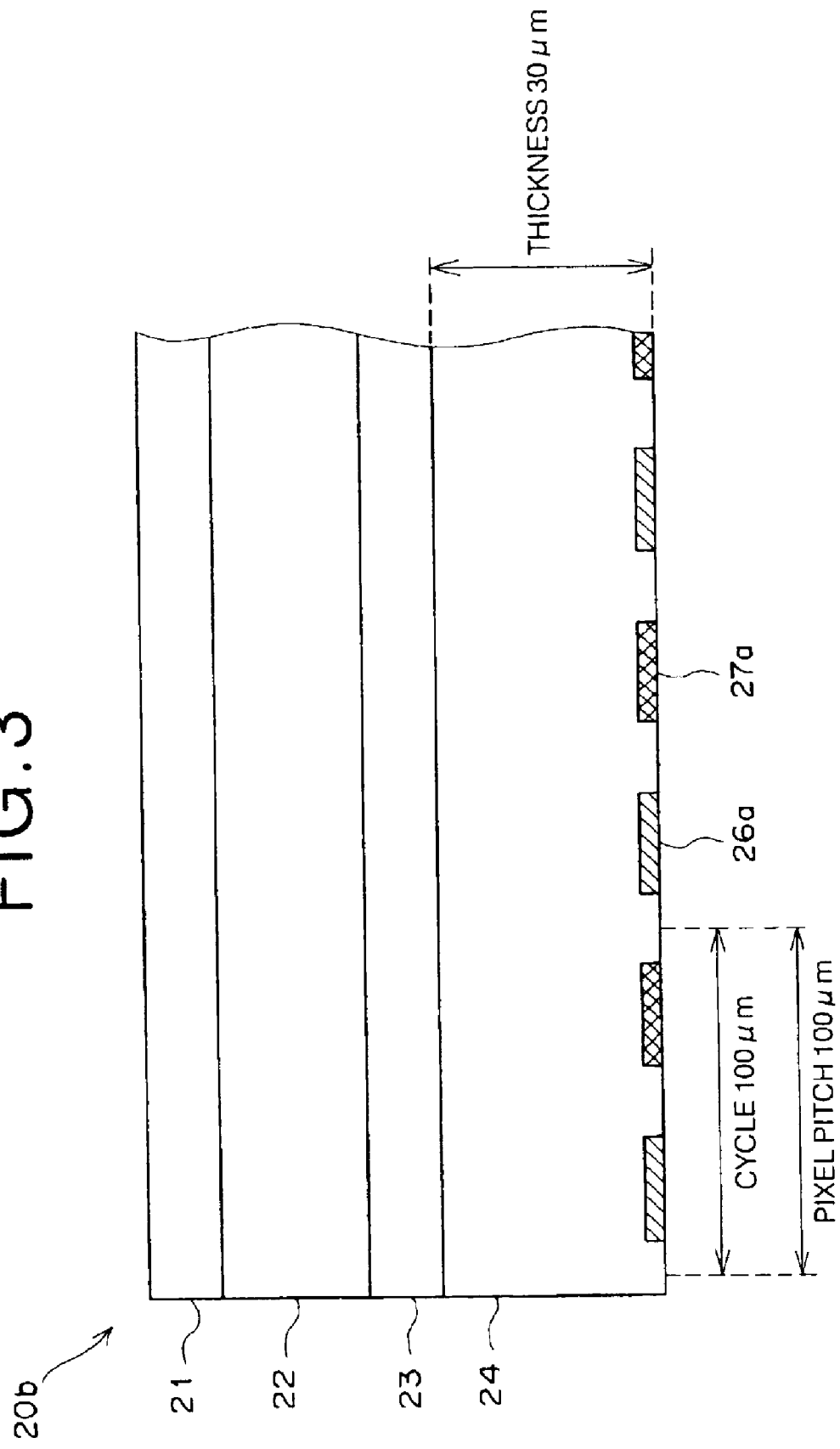
FIG. 3 is a cross-sectional view of a solid state radiation detector according to a second embodiment of the present invention.

Next, description will be made for a second embodiment of the solid state radiation detector according to the present invention with reference to FIG. 3. FIG. 3 is across-sectional view of a solid state radiation detector 20b according to this embodiment. Note that, in this drawing, illustration of the support body 18, the insulating layer 30 and the light-shielding films 31 is omitted. Moreover, in FIG. 3, elements equivalent to the elements of the detector 20a according to the first embodiment, which are shown in FIG. 1, are denoted by the same reference numerals, and description thereof will be omitted as long as a particular necessity does not arise. Note that the solid state radiation detector of this embodiment also corresponds to the first solid state radiation detector according to the present invention.

This solid state radiation detector 20b includes: the first conductive layer 21, the recording photoconductive layer 22, the charge transport layer 23, the reading photoconductive layer 24, the second conductive layer 25 having the stripe electrodes 26 and the sub-stripe electrodes 27, the insulating layer 30, and the support body 18, the solid state radiation detector 20b being composed by arranging the above-described constituents in accordance with the order listed above. Moreover, on the portions on the support body 18, which correspond to the elements 27a and the spaces between the elements 26a and the elements 27a, there are provided the light-shielding films 31. For each layer, a material similar to that of the detector 20a according to the first embodiment is used.

Note that, in this embodiment, the thickness of the reading photoconductive layer 24 is set at 30 μm. Moreover, each width of the elements 26a and 27a is set at 30 μm, and the width of the space between the adjacent elements is set at 20 μm. Namely, one cycle is set at 100 μm. Furthermore, the pixel pitch is set at 100 μm, and the electrodes for one pixel are constituted of one pair of elements.

Also in this embodiment, the cycle is set at 100 μm, which is within the preferable range from 10 μm through 150 μm. Therefore, it is possible to obtain an effect similar to that in the first embodiment.

Figure 4:
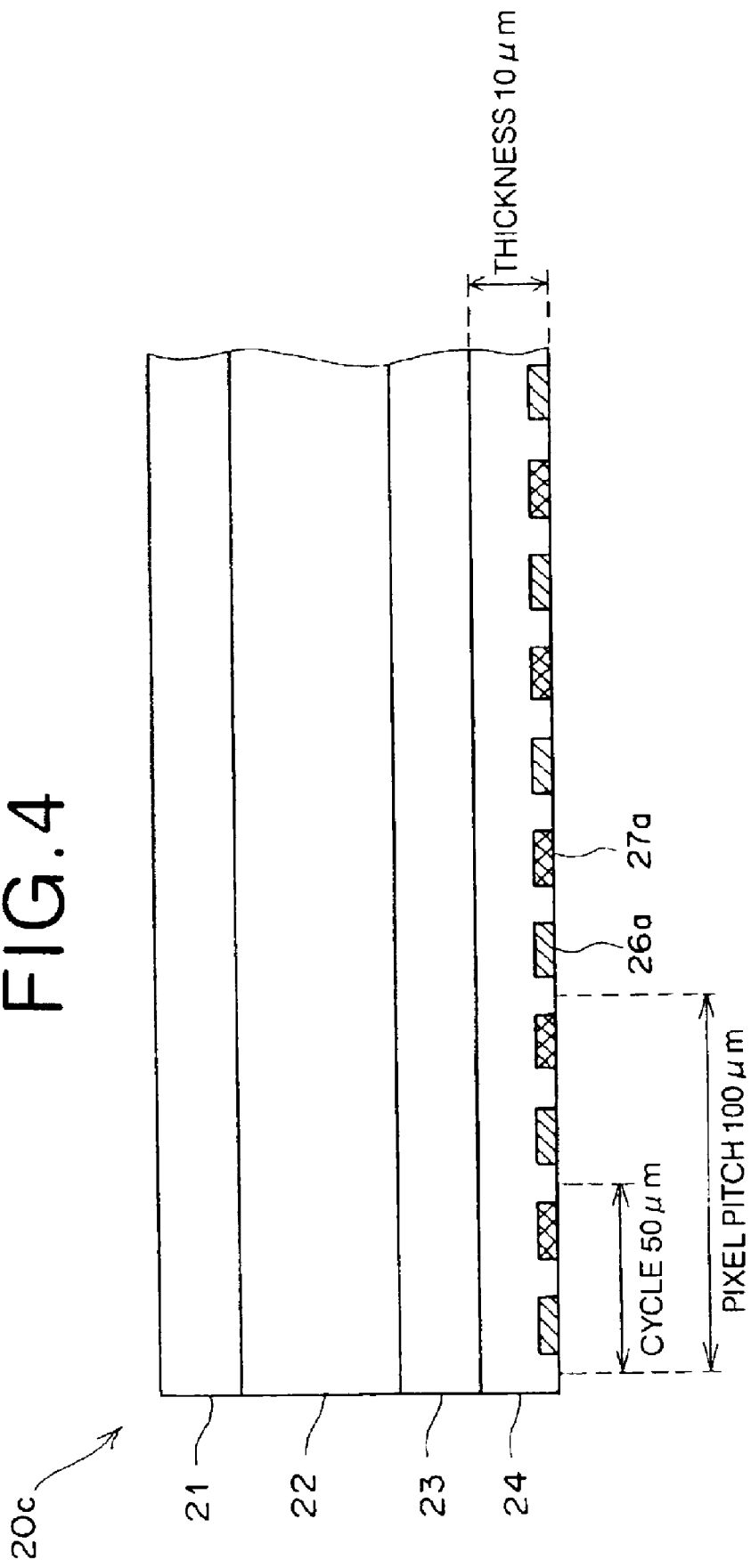
FIG. 4 is a cross-sectional view of a solid state radiation detector according to a third embodiment of the present invention.

Next, description will be made for a third embodiment of the solid state radiation detector according to the present invention with reference to FIG. 4. FIG. 4 is a cross-sectional view of a solid state radiation detector 20c according to this embodiment. Note that, in this drawing, illustration of the support body 18, the insulating layer 30 and the light-shielding films 31 is omitted. Moreover, in FIG. 4, elements equivalent to the elements of the detector 20a according to the first embodiment, which are shown in FIG. 1, are denoted by the same reference numerals, and description thereof will be omitted as long as a particular necessity does not arise. Note that the solid state radiation detector of this embodiment also corresponds to the first solid state radiation detector according to the present invention.

This solid state radiation detector 20c includes the first conductive layer 21, the recording photoconductive layer 22, the charge transport layer 23, the reading photoconductive layer 24, the second conductive layer 25 having the stripe electrodes 26 and the sub-stripe electrodes 27, the insulating layer 30, and the support body 18, the solid state radiation detector 20c being composed by arranging the above-described constituents in accordance with the order listed above. Moreover, on the portions on the support body 18, which correspond to the elements 27a and the spaces between the elements 26a and the elements 27a, there are provided the light-shielding films 31. For each layer, a material similar to that of the detector 20a according to the first embodiment is used.

Note that, in this embodiment, the thickness of the reading photoconductive layer 24 is set at 10 μm. Moreover, each width of the elements 26a and 27a is set at 15 μm, and the width of the space between the adjacent elements is set at 10

μm. Namely, one cycle is set at 50 μm. Furthermore, the pixel pitch is set at 100 μm, and the electrodes for one pixel are constituted of two pairs of elements.

Also in this embodiment, the cycle is set at 50 μm, which is within the preferable range from 10 μm through 150 μm. Therefore, it is possible to obtain an effect similar to that in the first embodiment.

Figure 5:
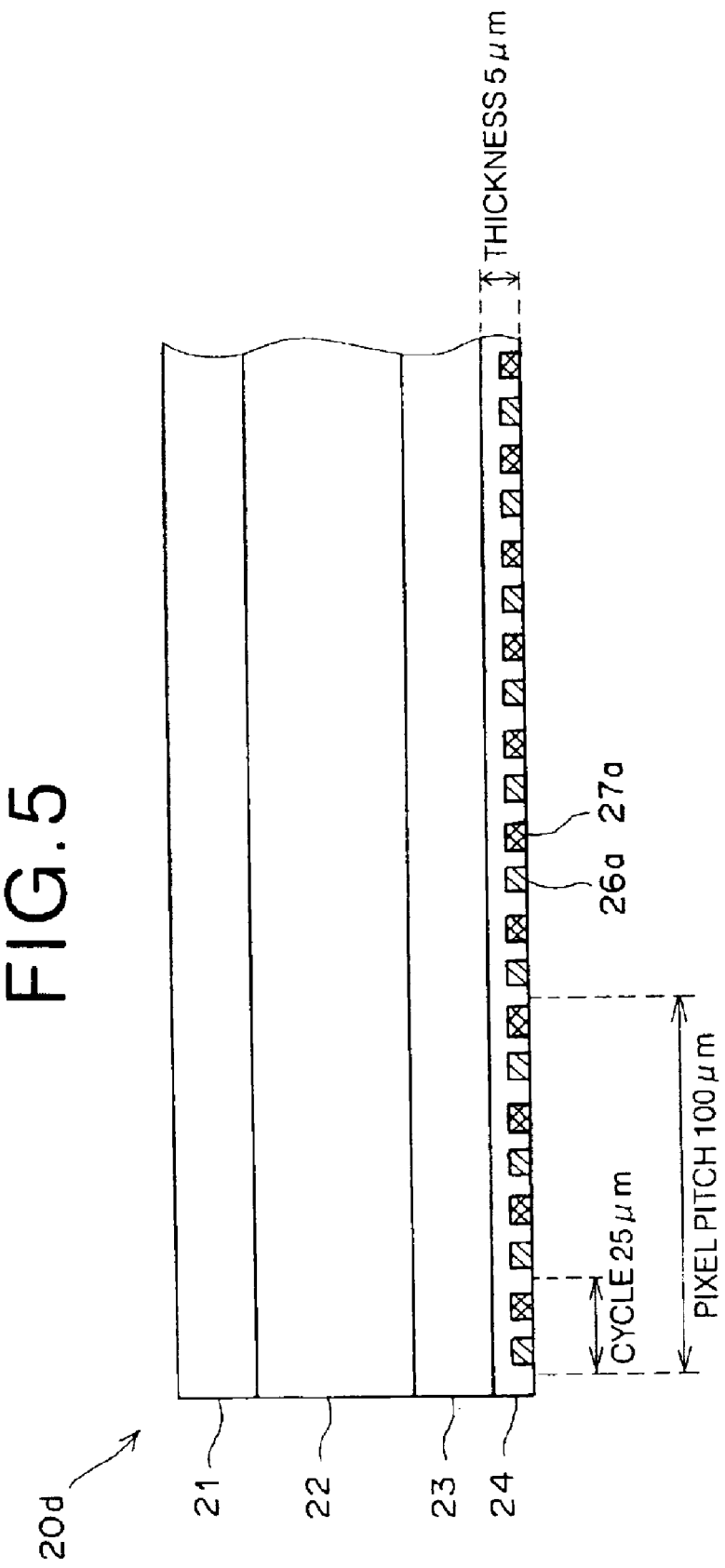
FIG. 5 is a cross-sectional view of a solid state radiation detector according to a fourth embodiment of the present invention.

Next, description will be made for a fourth embodiment of the solid state radiation detector according to the present invention with reference to FIG. 5. FIG. 5 is a cross-sectional view of a solid state radiation detector 20d according to this embodiment. Note that, in this drawing, illustration of the support body 18, the insulating layer 30 and the light-shielding films 31 is omitted. Moreover, in FIG. 5, elements equivalent to the elements of the detector 20a according to the first embodiment, which are shown in FIG. 1, are denoted by the same reference numerals, and description thereof will be omitted as long as a particular necessity does not arise. Note that the solid state radiation detector of this embodiment also corresponds to the first solid state radiation detector according to the present invention.

This solid state radiation detector 20d includes the first conductive layer 21, the recording photoconductive layer 22, the charge transport layer 23, the reading photoconductive layer 24, the second conductive layer 25 having the stripe electrodes 26 and the sub-stripe electrodes 27, the insulating layer 30, and the support body 18, the solid state radiation detector 20d being composed by arranging the above-described constituents in accordance with the order listed above. Moreover, on the portions on the support body 18, which correspond to the elements 27a and the spaces between the elements 26a and the elements 27a, there are provided the light-shielding films 31. For each layer, a material similar to that of the detector 20a according to the first embodiment is used.

Note that, in this embodiment, the thickness of the reading photoconductive layer 24 is set at 5 μm. Moreover, each width of the elements 26a and 27a is set at 7.5 μm, and the width of the space between the adjacent elements is set at 5 μm. Namely, one cycle is set at 25 μm. Furthermore, the pixel pitch is set at 100 μm, and the electrodes for one pixel are constituted of four pairs of elements.

Also in this embodiment, the cycle is set at 25 μm, which is within the preferable range from 10 μm through 150 μm. Therefore, it is possible to obtain an effect similar to that in the first embodiment.

Figure 6:
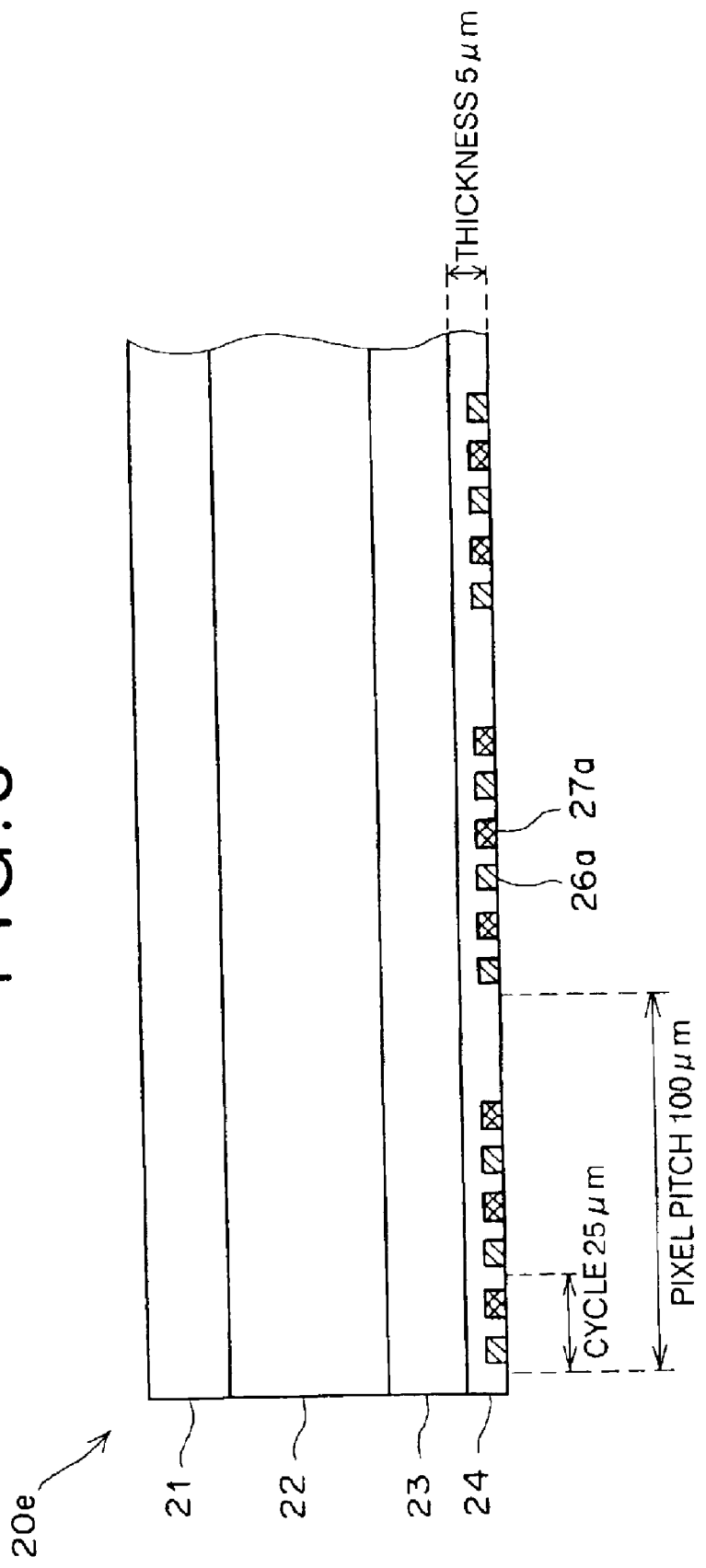
FIG. 6 is a cross-sectional view of a solid state radiation detector according to a fifth embodiment of the present invention.

Next, description will be made for a fifth embodiment of the solid state radiation detector according to the present invention with reference to FIG. 6. FIG. 6 is a cross-sectional view of a solid state radiation detector 20e according to this embodiment. Note that, in this drawing, illustration of the support body 18, the insulating layer 30 and the light-shielding films 31 is omitted. Moreover, in FIG. 6, elements equivalent to the elements of the detector 20a according to the first embodiment, which are shown in FIG. 1, are denoted by the same reference numerals, and description thereof will be omitted as long as a particular necessity does not arise. Note that the solid state radiation detector of this embodiment also corresponds to the first solid state radiation detector according to the present invention.

This solid state radiation detector 20e includes the first conductive layer 21, the recording photoconductive layer 22, the charge transport layer 23, the reading photoconductive layer 24, the second conductive layer 25 having the stripe electrodes 26 and the sub-stripe electrodes 27, the insulating layer 30, and the support body 18, the solid state radiation detector 20e being composed by arranging the above-described constituents in accordance with the order listed above. Moreover, on the portions on the support body 18, which correspond to the elements 27a and the spaces between the elements 26a and the elements 27a, there are provided the light-shielding films 31. For each layer, a material similar to that of the detector 20a according to the first embodiment is used.

Note that, in this embodiment, the thickness of the reading photoconductive layer 24 is set at 5 μm. Moreover, each width of the elements 26a and 27a is set at 7.5 μm, and the width of the space between the adjacent elements is set at 5 μm. Namely, one cycle is set at 25 μm. Furthermore, the pixel pitch is set at 100 μm, and the electrodes for one pixel are constituted of three pairs of elements, in which an interval for one pair is spaced for every three pairs.

Also in this embodiment, the cycle is set at 25 μm, which is within the preferable range from 10 μm through 150 μm. Therefore, it is possible to obtain an effect similar to that in the first embodiment.

Figure 7:
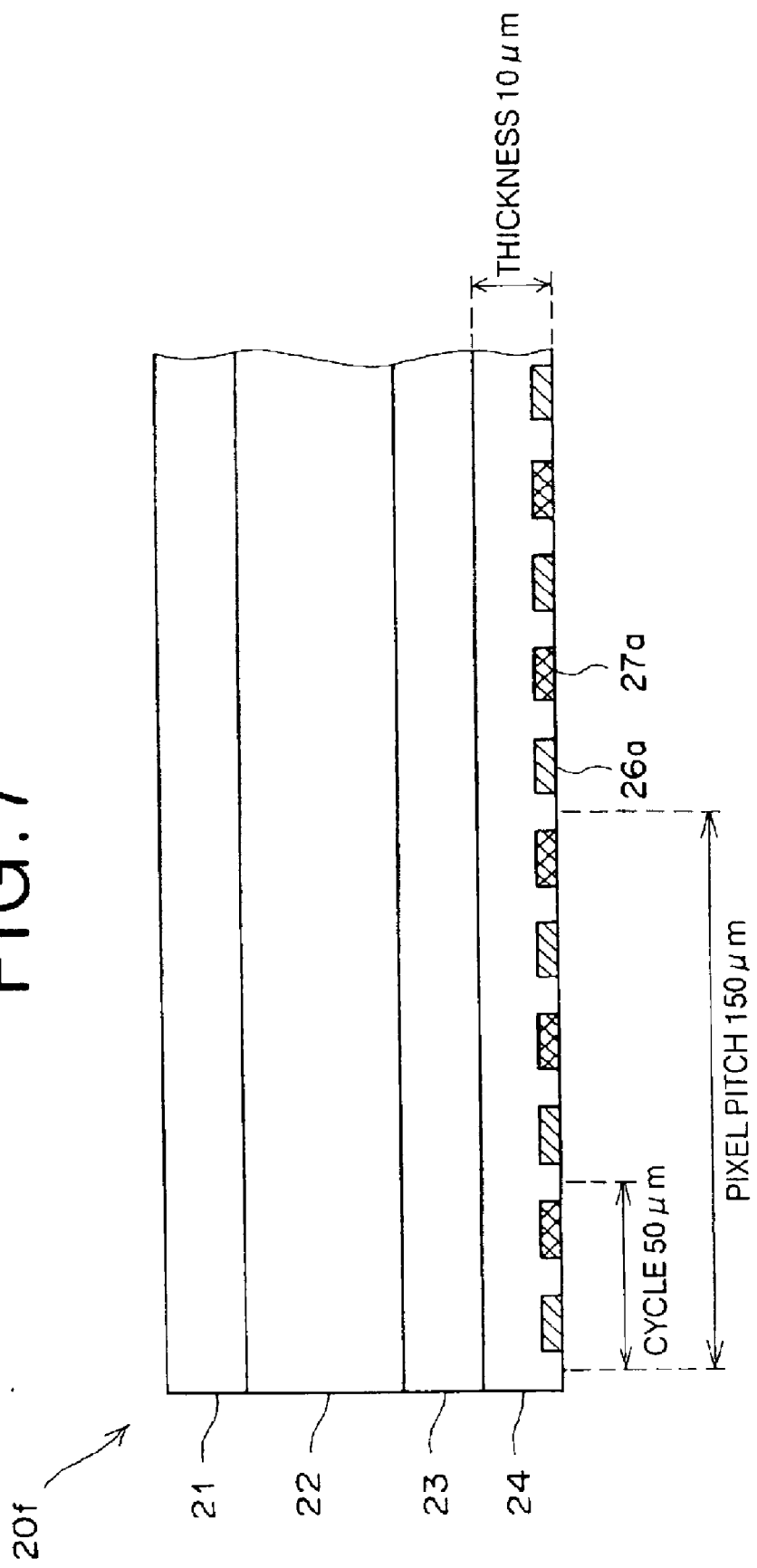
FIG. 7 is a cross-sectional view of a solid state radiation detector according to a sixth embodiment of the present invention.

Next, description will be made for a sixth embodiment of the solid state radiation detector according to the present invention with reference to FIG. 7. FIG. 7 is a cross-sectional view of a solid state radiation detector 20f according to this embodiment. Note that, in this drawing, illustration of the support body 18, the insulating layer 30 and the light-shielding films 31 is omitted. Moreover, in FIG. 7, elements equivalent to the elements of the detector 20a according to the first embodiment, which are shown in FIG. 1, are denoted by the same reference numerals, and description thereof will be omitted as long as a particular necessity does not arise. Note that the solid state radiation detector of this embodiment also corresponds to the first solid state radiation detector according to the present invention.

This solid state radiation detector 20f includes the first conductive layer 21, the recording photoconductive layer 22, the charge transport layer 23, the reading photoconductive layer 24, the second conductive layer 25 having the stripe electrodes 26 and the sub-stripe electrodes 27, the insulating layer 30, and the support body 18, the solid state radiation detector 20f being composed by arranging the above-described constituents in accordance with the order listed above. Moreover, on the portions on the support body 18, which correspond to the elements 27a and the spaces between the elements 26a and the elements 27a, there are provided the light-shielding films 31. For each layer, a material similar to that of the detector 20a according to the first embodiment is used.

Note that, in this embodiment, the thickness of the reading photoconductive layer 24 is set at 10 μm. Moreover, each width of the elements 26a and 27a is set at 15 μm, and the width of the space between the adjacent elements is set at 10 μm. Namely, one cycle is set at 50 μm. Furthermore, the pixel pitch is set at 150 μm, and the electrodes for one pixel are constituted of three pairs of elements.

Also in this embodiment, the cycle is set at 50 μm, which is within the preferable range from 10 μm through 150 μm. Therefore, it is possible to obtain an effect similar to that in the first embodiment.

Figure 8:
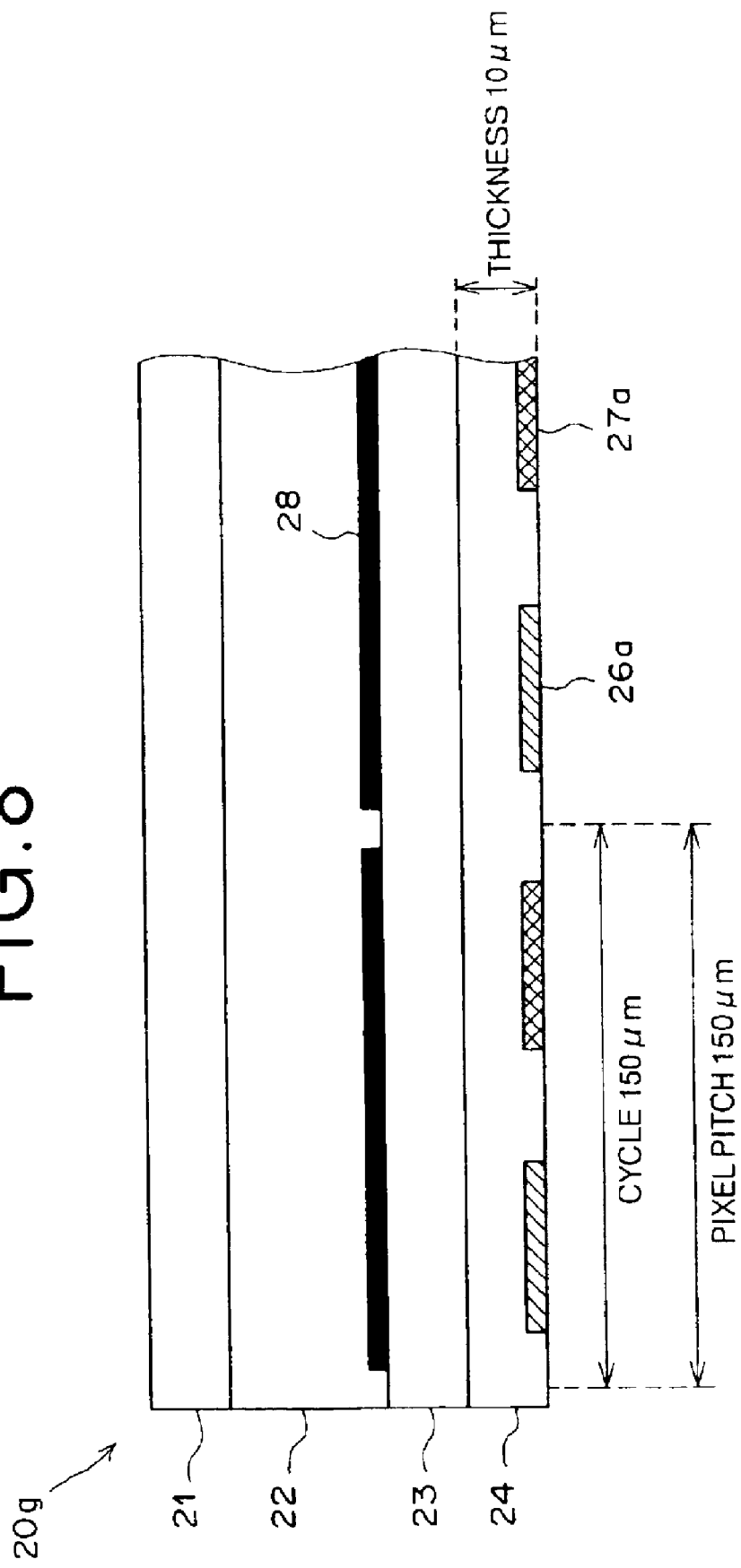
FIG. 8 is a cross-sectional view of a solid state radiation detector according to a seventh embodiment of the present invention.

Next, description will be made for a seventh embodiment of the solid state radiation detector according to the present invention with reference to FIG. 8. FIG. 8 is a cross-sectional view of a solid state radiation detector 20g according to this embodiment. Note that, in this drawing, illustration of the support body 18, the insulating layer 30 and the light-shielding films 31 is omitted. Moreover, in FIG. 8, elements equivalent to the elements of the detector 20a according to the first embodiment, which are shown in FIG.

1, are denoted by the same reference numerals, and description thereof will be omitted as long as a particular necessity does not arise. Note that the solid state radiation detector of this embodiment also corresponds to the first solid state radiation detector according to the present invention.

This solid state radiation detector 20g includes the first conductive layer 21, the recording photoconductive layer 22, the charge transport layer 23, the reading photoconductive layer 24, the second conductive layer 25 having the stripe electrodes 26 and the sub-stripe electrodes 27, the insulating layer 30, and the support body 18, the solid state radiation detector 20g being composed by arranging the above-described constituents in accordance with the order listed above. Moreover, on the portions on the support body 18, which correspond to the elements 27a and the spaces between the elements 26a and the elements 27a, there are provided the light-shielding films 31. For each layer, a material similar to that of the detector 20a according to the first embodiment is used.

Note that, in this embodiment, the thickness of the reading photoconductive layer 24 is set at 10 µm. Moreover, each width of the elements 26a and 27a is set at 45 µm, and the width of the space between the adjacent elements is set at 30 µm. Namely, one cycle is set at 150 µm. Furthermore, the pixel pitch is set at 150 µm, and the electrodes for one pixel are constituted of one pair of elements.

Moreover, in this detector 20g, on the capacitor unit 29 as the interface between the recording photoconductive layer 22 and the charge transport layer 23, a large number of discrete and square microplates (micro conductive members) 28 are arranged immediately above the pairs of elements 26a and elements 27a with intervals spaced between the adjacent microplates 28. A length of each side of this microplate 28 is set to be approximately equal to the cycle (set to be a little smaller in order to provide the intervals between the adjacent microplates). Namely, the length is set at a dimension approximately equal to the minimum pixel pitch that can resolve an image. Positions where the microplates 28 are arranged become pixel positions on the detector.

Also in this embodiment, the cycle is set at 150 µm, which is within the preferable range from 10 µm through 150 µm. Therefore, it is possible to obtain an effect similar to that in the first embodiment.

Figure 9:
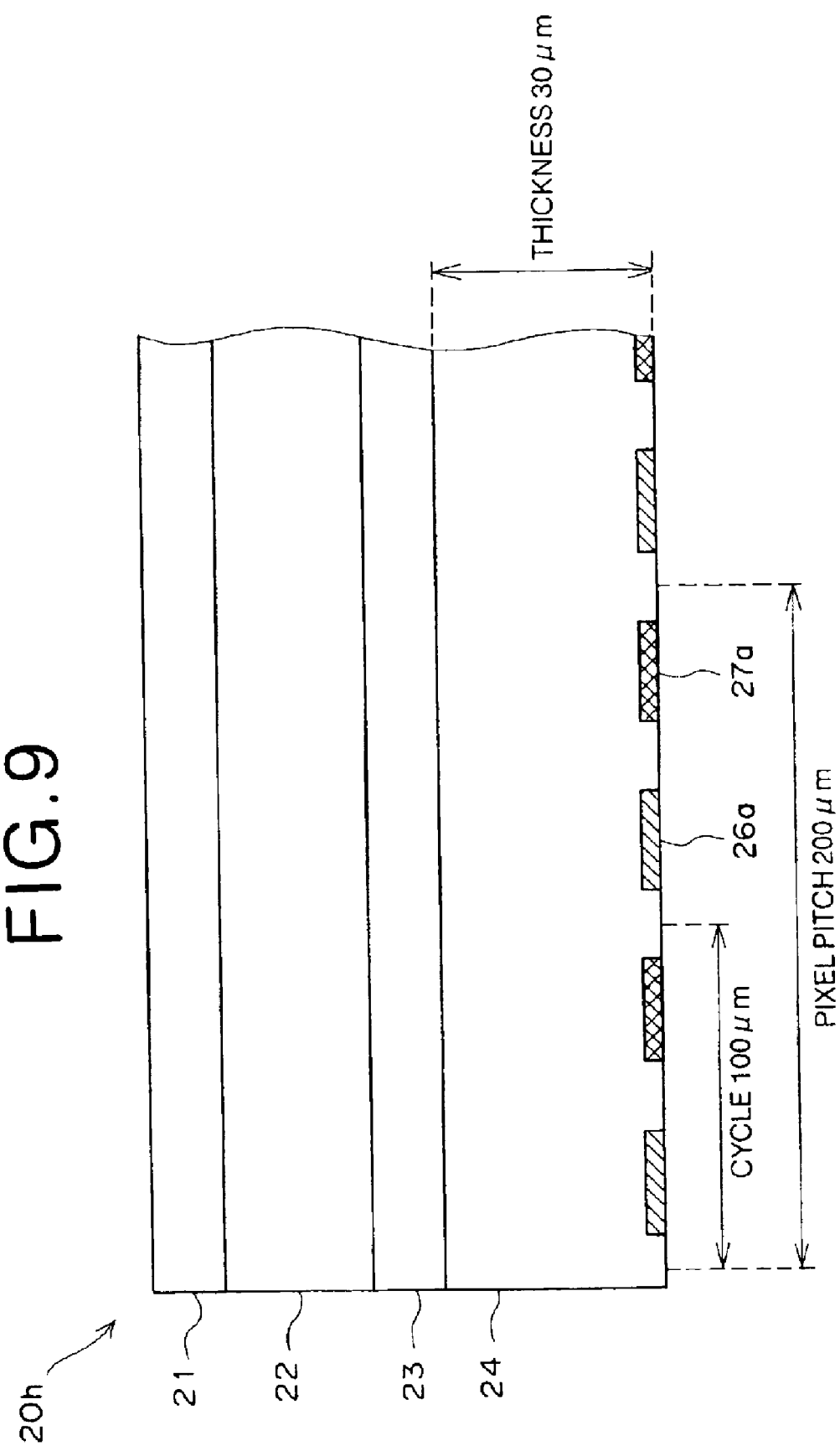
FIG. 9 is a cross-sectional view of a solid state radiation detector according to an eighth embodiment of the present invention.

Next, description will be made for an eighth embodiment of the solid state radiation detector according to the present invention with reference to FIG. 9. FIG. 9 is a cross-sectional view of a solid state radiation detector 20h according to this embodiment. Note that, in this drawing, illustration of the support body 18, the insulating layer 30 and the light-shielding films 31 is omitted. Moreover, in FIG. 9, elements equivalent to the elements of the detector 20a according to the first embodiment, which are shown in FIG. 1, are denoted by the same reference numerals, and description thereof will be omitted as long as a particular necessity does not arise. Note that the solid state radiation detector of this embodiment also corresponds to the first solid state radiation detector according to the present invention.

This solid state radiation detector 20h includes the first conductive layer 21, the recording photoconductive layer 22, the charge transport layer 23, the reading photoconductive layer 24, the second conductive layer 25 having the stripe electrodes 26 and the sub-stripe electrodes 27, the insulating layer 30, and the support body 18, the solid state radiation detector 20h being composed by arranging the above-described constituents in accordance with the order listed above. Moreover, on the portions on the support body 18, which correspond to the elements 27a and the spaces between the elements 26a and the elements 27a, there are provided the light-shielding films 31. For each layer, a material similar to that of the detector 20a according to the first embodiment is used.

Note that, in this embodiment, the thickness of the reading photoconductive layer 24 is set at 30 µm. Moreover, each width of the elements 26a and 27a is set at 30 µm, and the width of the space between the adjacent elements is set at 20 µm. Namely, one cycle is set at 100 µm. Furthermore, the pixel pitch is set at 200 µm, and the electrodes for one pixel are constituted of two pairs of elements.

Also in this embodiment, the cycle is set at 100 µm, which is within the preferable range from 10 µm through 150 µm. Therefore, it is possible to obtain an effect similar to that in the first embodiment.

Figure 10:
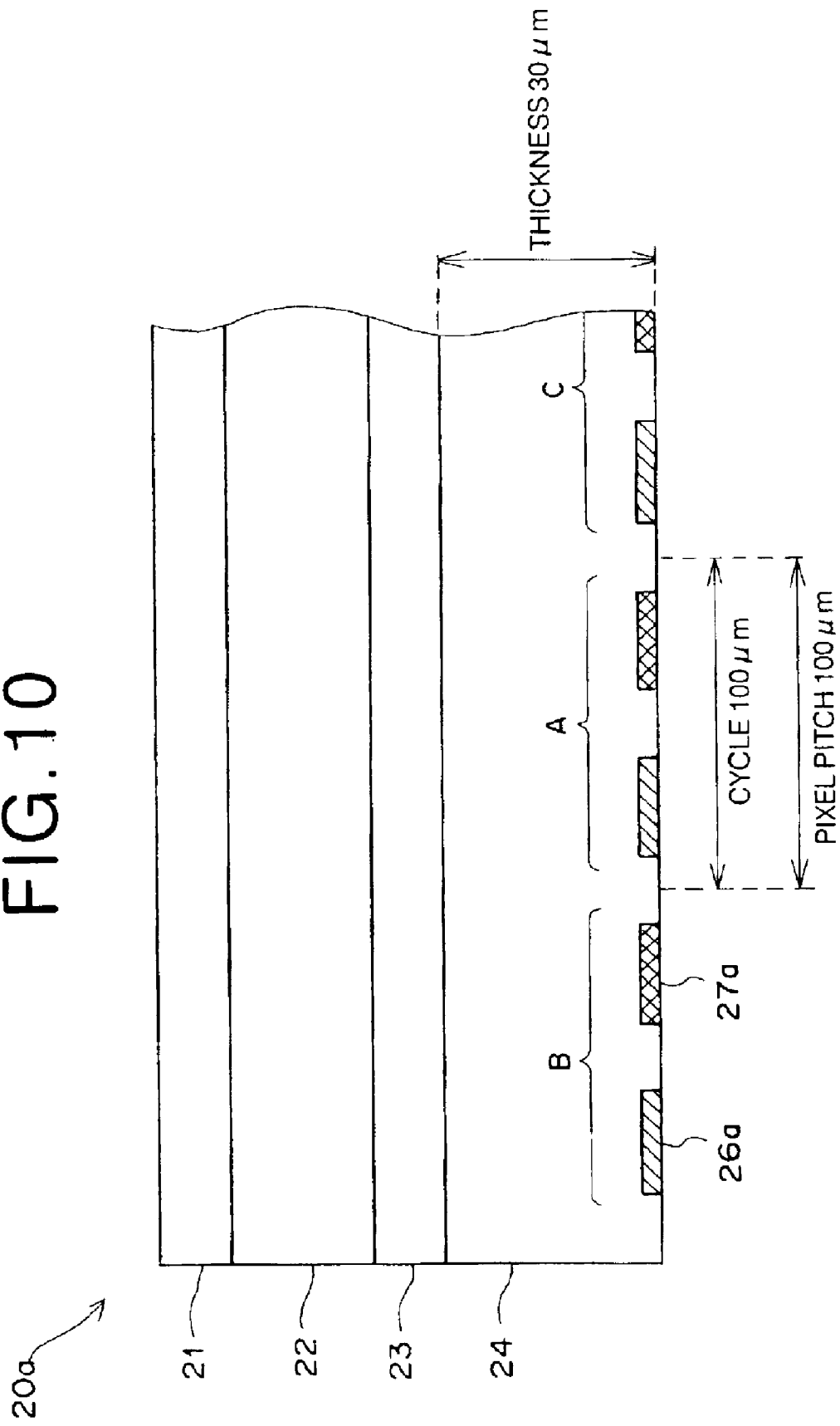
FIG. 10 is a cross-sectional view of a solid state radiation detector according to a ninth embodiment of the present invention.

Next, description will be made for a ninth embodiment of the solid state radiation detector according to the present invention with reference to FIG. 10. FIG. 10 is a cross-sectional view of a solid state radiation detector 20i according to this embodiment. Note that, in this drawing, illustration of the support body 18, the insulating layer 30 and the light-shielding films 31 is omitted. Moreover, in FIG. 10, elements equivalent to the elements of the detector 20a according to the first embodiment, which are shown in FIG. 1, are denoted by the same reference numerals, and description thereof will be omitted as long as a particular necessity does not arise. Note that the solid state radiation detector of this embodiment corresponds to the second solid state radiation detector according to the present invention.

This solid state radiation detector 20i includes the first conductive layer 21, the recording photoconductive layer 22, the charge transport layer 23, the reading photoconductive layer 24, the second conductive layer 25 having the stripe electrodes 26 and the sub-stripe electrodes 27, the insulating layer 30, and the support body 18, the solid state radiation detector 20i being composed by arranging the above-described constituents in accordance with the order listed above. Moreover, on the portions on the support body 18, which correspond to the elements 27a and the spaces between the elements 26a and the elements 27a, there are provided the light-shielding films 31. For each layer, a material similar to that of the detector 20a according to the first embodiment is used.

Note that, in this embodiment, the thickness of the reading photoconductive layer 24 is set at 30 µm. Moreover, each width of the elements 26a and 27a is set at 30 µm, and the width of the space between the adjacent elements is set at 20 µm. Namely, one cycle is set at 100 µm. Furthermore, the pixel pitch is set at 100 µm, and the electrodes for one pixel are constituted of one pair of elements. Moreover, in this embodiment, the ratio of the width of the element 27a (optical charge pair non-generating linear electrode) to the width of the element 26a (optical charge pair generating linear electrode) becomes 1.0.

In this embodiment, the ratio of the width of the element 27a to the width of the element 26a is set at 1.0 that is within the preferable range from 0.5 through 10. Therefore, the amount of extractable stored charges can be increased, and the reading efficiency and the S/N ratio of the image can be improved.

Figure 11:
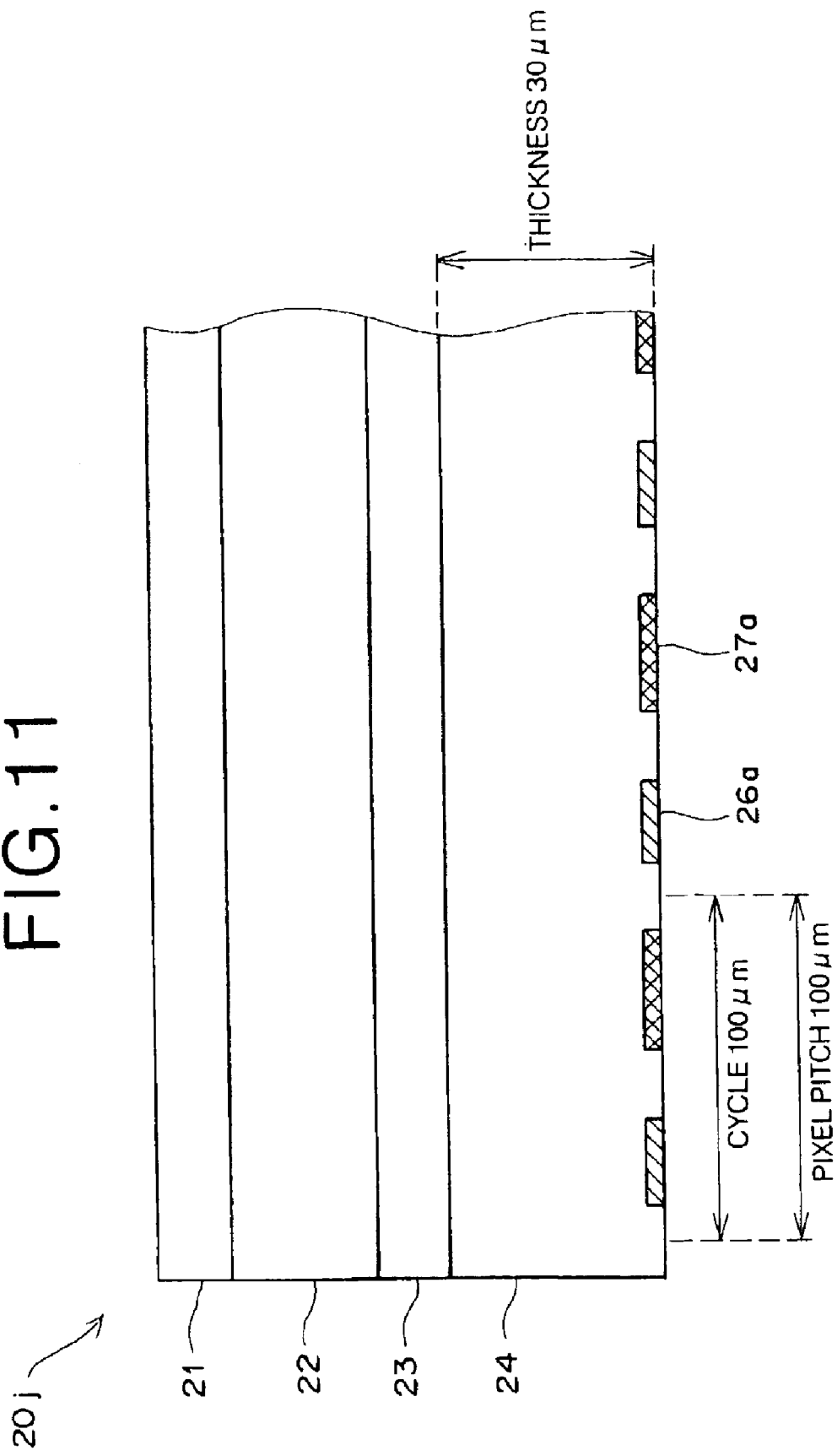
FIG. 11 is a cross-sectional view of a solid state radiation detector according to a tenth embodiment of the present invention.

Next, description will be made for a tenth embodiment of the solid state radiation detector according to the present invention with reference to FIG. 11. FIG. 11 is a cross-sectional view of a solid state radiation detector 20j according to this embodiment. Note that, in this drawing, illustration of the support body 18, the insulating layer 30 and the light-shielding films 31 is omitted. Moreover, in FIG. 11, elements equivalent to the elements of the detector 20a according to the first embodiment, which are shown in FIG. 1, are denoted by the same reference numerals, and description thereof will be omitted as long as a particular necessity does not arise. Note that the solid state radiation detector of this embodiment also corresponds to the second solid state radiation detector according to the present invention.

This solid state radiation detector 20j includes the first conductive layer 21, the recording photoconductive layer 22, the charge transport layer 23, the reading photoconductive layer 24, the second conductive layer 25 having the stripe electrodes 26 and the sub-stripe electrodes 27, the insulating layer 30, and the support body 18, the solid state radiation detector 20j being composed by arranging the above-described constituents in accordance with the order listed above. Moreover, on the portions on the support body 18, which correspond to the elements 27a and the spaces between the elements 26a and the elements 27a, there are provided the light-shielding films 31. For each layer, a material similar to that of the detector 20a according to the first embodiment is used.

Note that, in this embodiment, the thickness of the reading photoconductive layer 24 is set at 30 $\mu$m. Moreover, the width of the element 26a is set at 25 $\mu$m, the width of the element 27a is set at 35 $\mu$m, and the width of the space between the adjacent elements is set at 20 $\mu$m. Namely, one cycle is set at 100 $\mu$m. Furthermore, the pixel pitch is set at 100 $\mu$m, and the electrodes for one pixel are constituted of one pair of elements. Moreover, in this embodiment, the ratio of the width of the element 27a to the width of the element 26a becomes 1.4.

Also in this embodiment, the ratio of the width of the element 27a to the width of the element 26a is set at 1.4 that is within the preferable range from 0.5 through 10. Therefore, it is possible to obtain an effect similar to that of the ninth embodiment.

Figure 12:
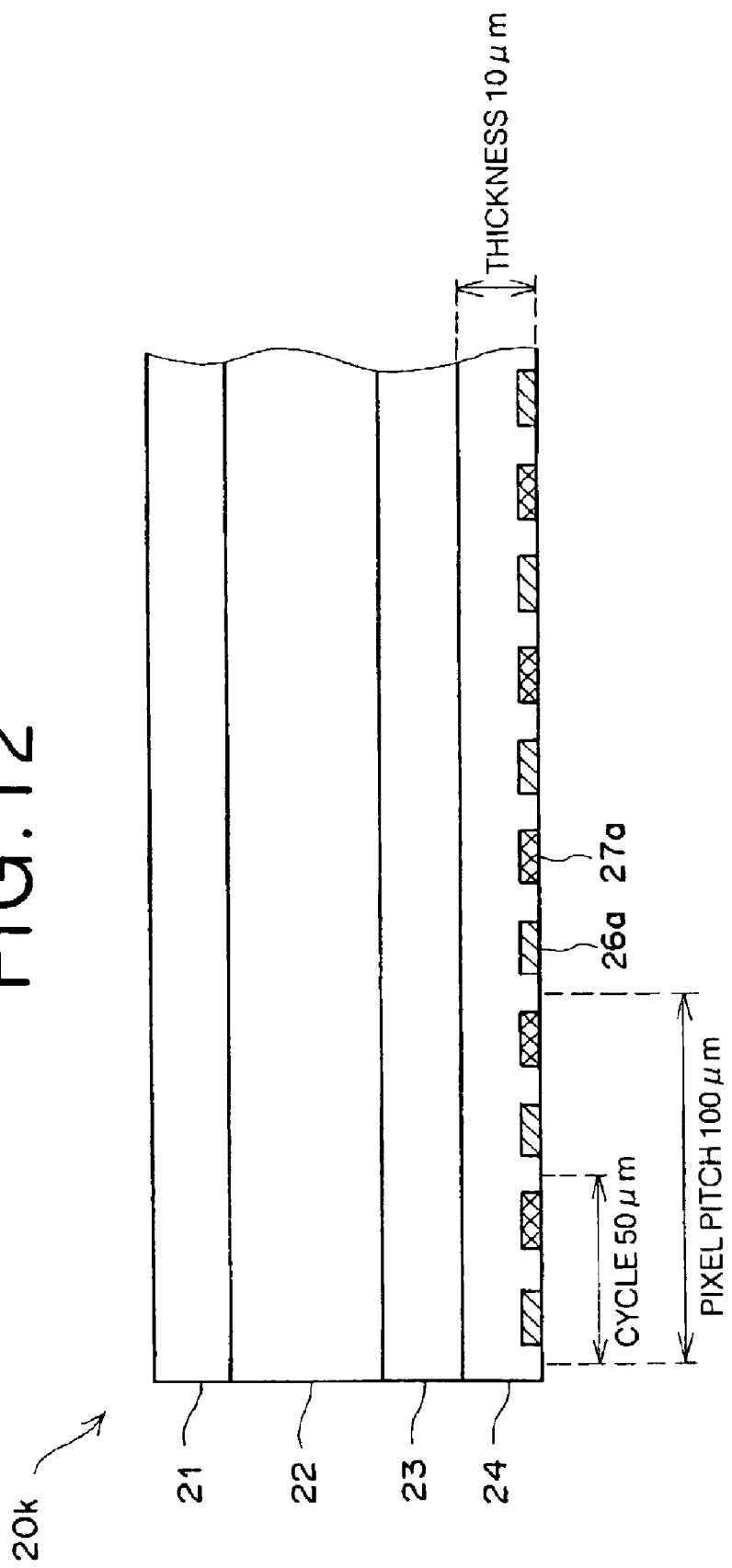
FIG. 12 is a cross-sectional view of a solid state radiation detector according to an eleventh embodiment of the present invention.

Next, description will be made for an eleventh embodiment of the solid state radiation detector according to the present invention with reference to FIG. 12. FIG. 12 is a cross-sectional view of a solid state radiation detector 20k according to this embodiment. Note that, in this drawing, illustration of the support body 18, the insulating layer 30 and the light-shielding films 31 is omitted. Moreover, in FIG. 12, elements equivalent to the elements of the detector 20a according to the first embodiment, which are shown in FIG. 1, are denoted by the same reference numerals, and description thereof will be omitted as long as a particular necessity does not arise. Note that the solid state radiation detector of this embodiment also corresponds to the second solid state radiation detector according to the present invention.

This solid state radiation detector 20k includes the first conductive layer 21, the recording photoconductive layer 22, the charge transport layer 23, the reading photoconductive layer 24, the second conductive layer 25 having the stripe electrodes 26 and the sub-stripe electrodes 27, the insulating layer 30, and the support body 18, the solid state radiation detector 20k being composed by arranging the above-described constituents in accordance with the order listed above. Moreover, on the portions on the support body 18, which correspond to the elements 27a and the spaces between the elements 26a and the elements 27a, there are provided the light-shielding films 31. For each layer, a material similar to that of the detector 20a according to the first embodiment is used.

Note that, in this embodiment, the thickness of the reading photoconductive layer 24 is set at 10 $\mu$m. Moreover, each width of the elements 26a and 27a is set at 15 $\mu$m, and the width of the space between the adjacent elements is set at 10 $\mu$m. Namely, one cycle is set at 50 $\mu$m. Furthermore, the pixel pitch is set at 100 $\mu$m, and the electrodes for one pixel are constituted of two pair of elements. Moreover, in this embodiment, the ratio of the width of the element 27a to the width of the element 26a becomes 1.0.

Also in this embodiment, the ratio of the width of the element 27a to the width of the element 26a is set at 1.0 that is within the preferable range from 0.5 through 10. Therefore, it is possible to obtain an effect similar to that of the ninth embodiment.

Figure 13:
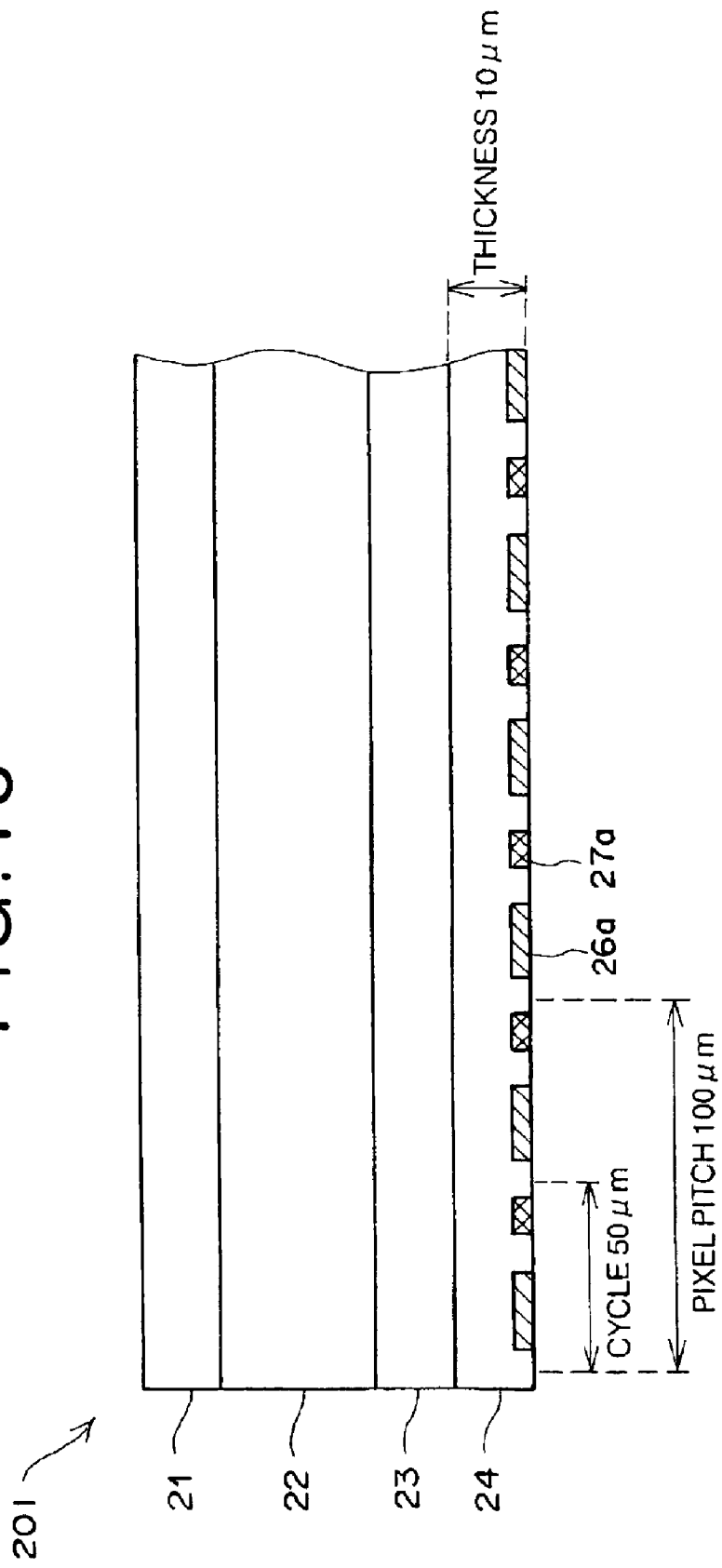
FIG. 13 is a cross-sectional view of a solid state radiation detector according to a twelfth embodiment of the present invention.

Next, description will be made for a twelfth embodiment of the solid state radiation detector according to the present invention with reference to FIG. 13. FIG. 13 is a cross-sectional view of a solid state radiation detector 201 according to this embodiment. Note that, in this drawing, illustration of the support body 18, the insulating layer 30 and the light-shielding films 31 is omitted. Moreover, in FIG. 13, elements equivalent to the elements of the detector 20a according to the first embodiment, which are shown in FIG. 1, are denoted by the same reference numerals, and description thereof will be omitted as long as a particular necessity does not arise. Note that the solid state radiation detector of this embodiment also corresponds to the second solid state radiation detector according to the present invention.

This solid state radiation detector 201 includes the first conductive layer 21, the recording photoconductive layer 22, the charge transport layer 23, the reading photoconductive layer 24, the second conductive layer 25 having the stripe electrodes 26 and the sub-stripe electrodes 27, the insulating layer 30, and the support body 18, the solid state radiation detector 201 being composed by arranging the above-described constituents in accordance with the order listed above. Moreover, on the portions on the support body 18, which correspond to the elements 27a and the spaces between the elements 26a and the elements 27a, there are provided the light-shielding films 31. For each layer, a material similar to that of the detector 20a according to the first embodiment is used.

Note that, in this embodiment, the thickness of the reading photoconductive layer 24 is set at 10 $\mu$m. Moreover, the width of the element 26a is set at 20 $\mu$m, the width of the element 27a is set at 10 $\mu$m, and the width of the space between the adjacent elements is set at 10 $\mu$m. Namely, one cycle is set at 50 $\mu$m. Furthermore, the pixel pitch is set at 100 $\mu$m, and the electrodes for one pixel are constituted of two pair of elements. Moreover, in this embodiment, the ratio of the width of the element 27a to the width of the element 26a becomes 0.5.

Also in this embodiment, the ratio of the width of the element 27a to the width of the element 26a is set at 0.5 that is within the preferable range from 0.5 through 10. Therefore, it is possible to obtain an effect similar to that of the ninth embodiment.

Figure 14:
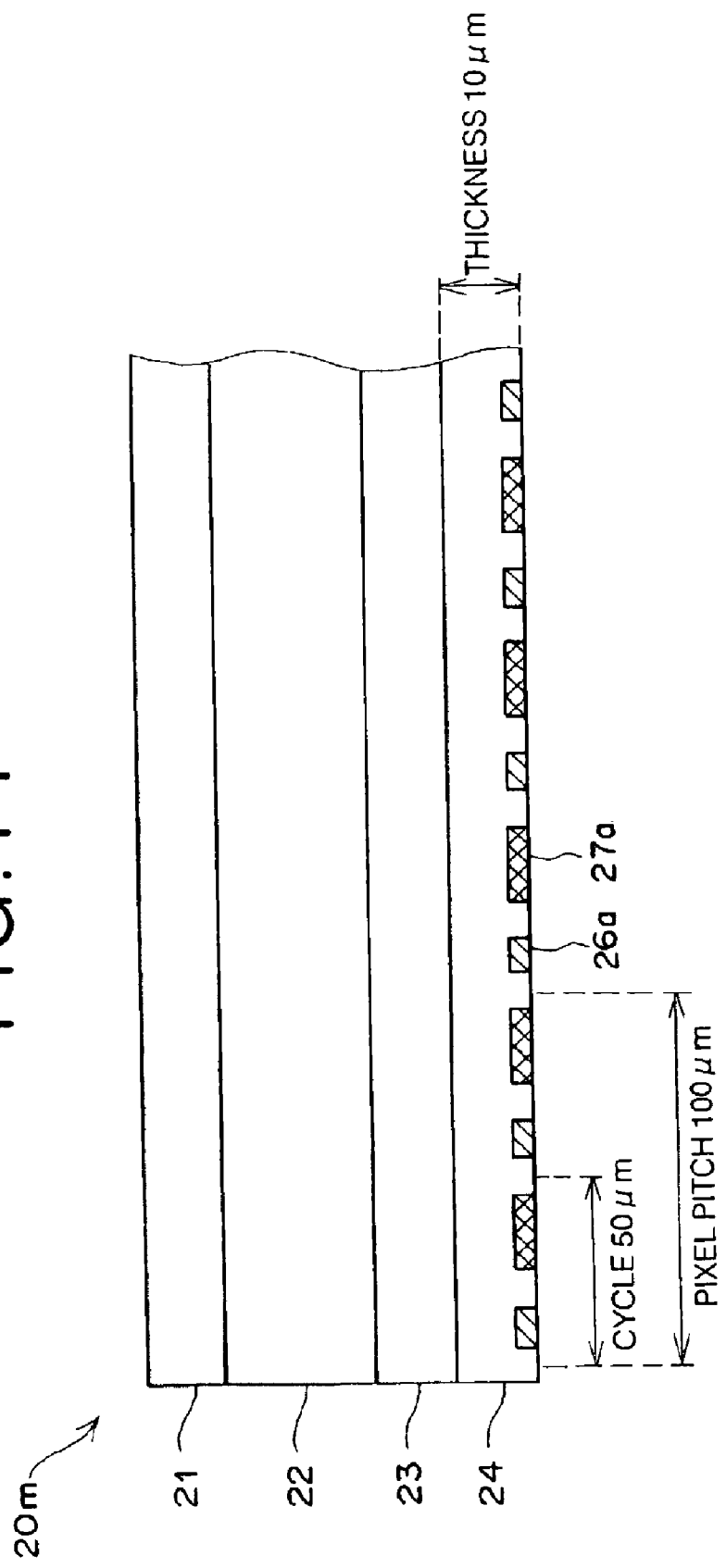
FIG. 14 is a cross-sectional view of a solid state radiation detector according to a thirteenth embodiment of the present invention.
Figure 15:
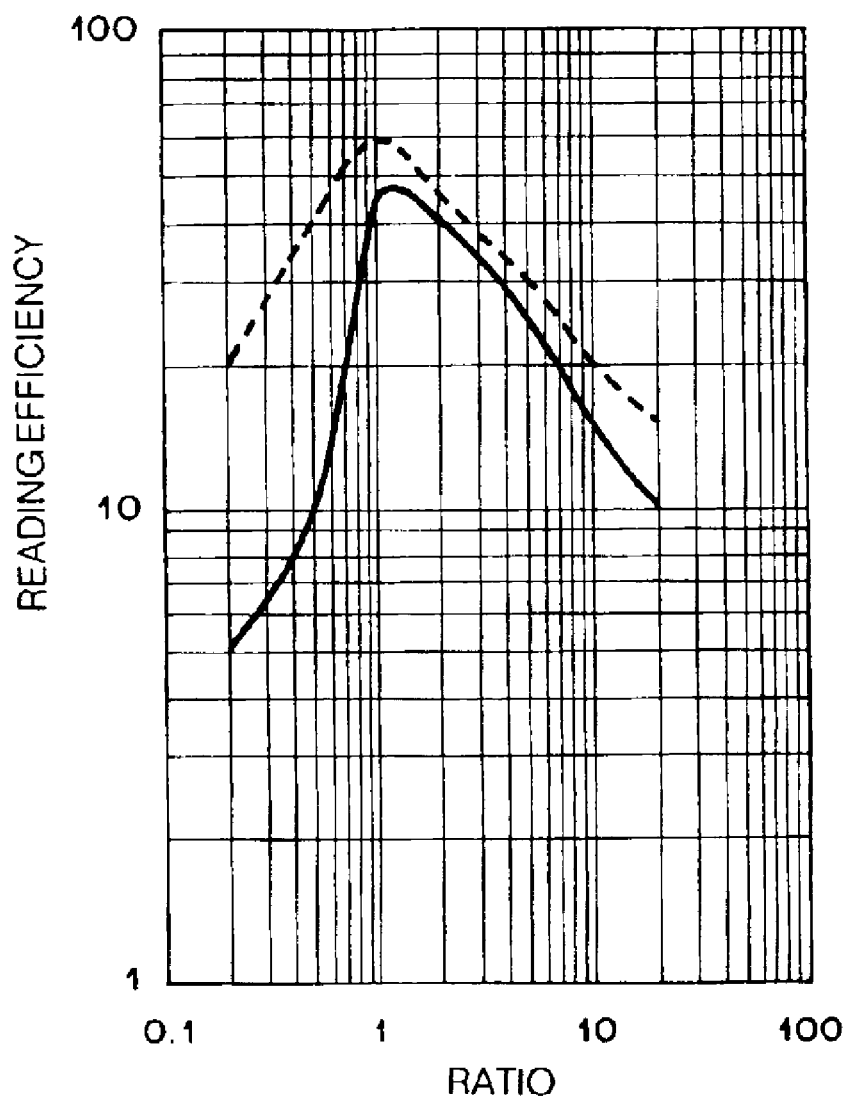
FIG. 15 is a graph showing a relationship between reading efficiency and a ratio of a width of an optical charge pair non-generating linear electrode to a width of an optical charge pair generating linear electrode.

Next, description will be made for a thirteenth embodiment of the solid state radiation detector according to the present invention with reference to FIG. 14. FIG. 14 is a cross-sectional view of a solid state radiation detector 20m according to this embodiment. Note that, in this drawing, illustration of the support body 18, the insulating layer 30 and the light-shielding films 31 is omitted. Moreover, in FIG. 14, elements equivalent to the elements of the detector 20a according to the first embodiment, which are shown in FIG. 1, are denoted by the same reference numerals, and description thereof will be omitted as long as a particular necessity does not arise. Note that the solid state radiation detector of this embodiment also corresponds to the second solid state radiation detector according to the present invention.

This solid state radiation detector 20m includes the first conductive layer 21, the recording photoconductive layer 22, the charge transport layer 23, the reading photoconductive layer 24, the second conductive layer 25 having the stripe electrodes 26 and the sub-stripe electrodes 27, the insulating layer 30, and the support body 18, the solid state radiation detector 20m being composed by arranging the above-described constituents in accordance with the order listed above. Moreover, on the portions on the support body 18, which correspond to the elements 27a and the spaces between the elements 26a and the elements 27a, there are provided the light-shielding films 31. For each layer, a material similar to that of the detector 20a according to the first embodiment is used.

Note that, in this embodiment, the thickness of the reading photoconductive layer 24 is set at 10 μm. Moreover, the width of the element 26a is set at 10 μm, the width of the element 27a is set at 20 μm, and the width of the space between the adjacent elements is set at 10 μm. Namely, one cycle is set at 50 μm. Furthermore, the pixel pitch is set at 100 μm, and the electrodes for one pixel are constituted of two pair of elements. Moreover, in this embodiment, the ratio of the width of the element 27a to the width of the element 26a becomes 2.0.

Also in this embodiment, the ratio of the width of the element 27a to the width of the element 26a is set at 2.0 that is within the preferable range from 0.5 through 10. Therefore, it is possible to obtain an effect similar to that of the ninth embodiment.

Note that, in the above description, description for the embodiments of the first solid state radiation detector according to the present invention and description for the embodiments of the second solid state radiation detector according to the present invention have been made distinctively. However, it is preferable to optimize both of the cycle of the pair of element 26a and element 27a and the ratio of the width of the element 27a to the width of the element 26a.

As above, description has been made for the preferred embodiments of the solid state radiation detector according to the present invention. However, the present invention is not limited to the above-described embodiments, and various modifications can be made as long as the gist of the invention is not changed.

For example, in any of the detectors according to the above-described embodiments, the recording photoconductive layer exhibits a conductivity by receiving the recording radiation. However, the recording photoconductive layer of the detector according to the present invention is not necessarily limited to this. The recording photoconductive layer may exhibit a conductivity by irradiation of the light generated by excitation of the recording radiation (refer to the gazette of Japanese Unexamined Patent Publication No. 2000-105297). In this case, the recording photoconductive layer is recommended to be formed in such a manner that, on the surface of the first conductive layer, a wavelength converting layer called an X-ray scintillator for converting a wavelength of the recording radiation into another range of wavelengths of, for example, blue light and the like is stacked. For this wavelength converting layer, for example, it is preferred to use cesium iodide (CsI) and the like. Moreover, the first conductive layer is set to have a transmissivity to the light generated in the wavelength converting layer by excitation of the recording radiation.

Moreover, in each of the detectors 20a to 20g according to the above-described embodiments, the charge transport layer is provided between the recording photoconductive layer and the reading photoconductive layer, and the capacitor unit is formed on the interface between the recording photoconductive layer and the charge transport layer. However, the charge transport layer may be replaced by the trap layer. In the case of adopting the trap layer, the latent image charges are trapped on the trap layer, and the latent image charges are stored in the trap layer or on the interface between the trap layer and the recording photoconductive layer. Moreover, the microplates may be provided on the interface between the trap layer and the recording photoconductive layer separately for each pixel.

What is claimed is:

1. A solid state radiation detector comprising:
a first conducting layer having a transmissivity to recording light;
a recording photoconductive layer exhibiting a photoconductivity by receiving irradiation of the recording light;
a capacitor unit for storing, as latent image charges, charges of an amount in response to an amount of the recording light;
a reading photoconductive layer exhibiting a photoconductivity by receiving irradiation of reading light; and
a second conductive layer including a large number of optical charge pair generating linear electrodes having a transmissivity to the reading light and a large number of optical charge pair non-generating linear electrodes arranged alternately with the optical charge pair generating linear electrodes,
the solid state radiation detector being composed by stacking the foregoing constituents in accordance with the order listed above,
wherein, when a pair of the optical charge pair generating linear electrode and the optical charge pair non-generating linear electrode is defined as one cycle, the cycle ranges from 10 μm through 150 μm.

2. The solid state radiation detector of claim 1,
wherein a ratio of the width of the optical charge pair non-generating linear electrode to the width of the optical charge pair generating linear electrode ranges from 0.5 through 10.

3. The solid state radiation detector according to claim 2,
wherein the ratio of the width of the optical charge pair non-generating linear electrode to the width of the optical charge pair generating linear electrode ranges from 0.8 through 1.5.

4. The solid state radiation detector according to claim 2, wherein the large number of optical charge pair generating linear electrodes and the large number of optical charge pair non-generating linear electrodes are coplanarly disposed.

5. The solid state radiation detector according to claim 2 further comprising an insulating layer, wherein the large number of optical charge pair generating linear electrodes and the large number of optical charge pair non-generating linear electrodes are coplanarly disposed on a surface of the insulating layer.

6. The solid state radiation detector according to claim 1, wherein the large number of optical charge pair generating linear electrodes and the large number of optical charge pair non-generating linear electrodes are coplanarly disposed.

* * * * *